(12) United States Patent
Mitchell et al.

(10) Patent No.: US 11,175,355 B2
(45) Date of Patent: Nov. 16, 2021

(54) SUPERCONDUCTING QUANTUM INTERFERENCE APPARATUS

(71) Applicant: Commonwealth Scientific and Industrial Research Organisation, Acton (AU)

(72) Inventors: Emma Mitchell, Acton (AU); Christopher John Lewis, Acton (AU)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 0 days.

(21) Appl. No.: 17/041,309

(22) PCT Filed: Mar. 29, 2019

(86) PCT No.: PCT/AU2019/050286
§ 371 (c)(1),
(2) Date: Sep. 24, 2020

(87) PCT Pub. No.: WO2019/183687
PCT Pub. Date: Oct. 3, 2019

(65) Prior Publication Data
US 2021/0018575 A1  Jan. 21, 2021

(30) Foreign Application Priority Data

Mar. 29, 2018 (AU) ............................... 2018901053

(51) Int. Cl.
*G01R 33/035* (2006.01)
*H01L 39/02* (2006.01)
(Continued)

(52) U.S. Cl.
CPC ........ *G01R 33/0354* (2013.01); *H01L 39/025* (2013.01); *H01L 39/06* (2013.01); *H01L 39/08* (2013.01); *H01L 39/225* (2013.01)

(58) Field of Classification Search
CPC ... G01R 33/0354; H01L 39/025; H01L 39/06; H01L 39/08; H01L 39/225
See application file for complete search history.

(56) References Cited

U.S. PATENT DOCUMENTS

| 5,532,485 A | 7/1996 | Bluzer et al. | |
| 2010/0079221 A1* | 4/2010 | Shiokawa | H01P 1/20381 |
| | | | 333/204 |

FOREIGN PATENT DOCUMENTS

WO   WO 2017/006079 A1   1/2017

OTHER PUBLICATIONS

Notice of Acceptance and Claims as Accepted in Australian Patent Application No. 2019240774, dated Oct. 15, 2020.
(Continued)

*Primary Examiner* — Paul A Wartalowicz
(74) *Attorney, Agent, or Firm* — Crowell & Moring LLP

(57) ABSTRACT

This disclosure relates to Superconducting Quantum Interference Apparatuses, such as SQUID arrays and SQUIFs. A superconducting quantum interference apparatus comprises an array of loops each loop constituting a superconducting quantum interference device. The array comprises multiple columns, each of the columns comprises multiple rows connected in series, each of the multiple rows comprises a number of loops connected in parallel, and the number of loops connected in parallel in each row is more than two and less than 20 to improve a performance of the apparatus. It is an advantage that keeping the number of loops in parallel below 20 improves the performance of the apparatus. This is contrary to existing knowledge where it is commonly assumed that a larger number of parallel loops would increase performance.

23 Claims, 21 Drawing Sheets

(51) Int. Cl.
  *H01L 39/06* (2006.01)
  *H01L 39/08* (2006.01)
  *H01L 39/22* (2006.01)

(56) References Cited

OTHER PUBLICATIONS

International Preliminary Report on Patentability for corresponding PCT international application No. PCT/AU2019/050286 dated Oct. 10, 2019.
International Search Report for corresponding PCT international application No. PCT/AU2019/050286 dated May 23, 2019.
Mitchell, E., et al., "2D SQIF arrays using 20 000 YBCO high RN Josephson junctions," Superconductor Science and Technology 29.6 (2016: 06LT01. pp. 1-8 Abstract, figures 1(a), (b), (c), and (d); p. 2, col. 2; p. 4, col. 2.
Prokopenko, G., et al., "DC and RF measurements of serial bi-squid Arrays," IEEE Transactions on Applied Superconductivity 23.3 (2013): 1400607-1400607, pp. 1-7.
Schultze, V., et al., "How to puzzle out a good high-Tc superconducting quantum interference filter," Superconductor Science and Technology 19.5 (2006): S411-S415, Abstract.
Taylor, B., et al., "Characterization of large two-dimensional $YBa_2Cu_3O_{7-\delta}$ SQUID arrays," Superconductor Science and Technology 29..8 (2016): 084003, pp. 1-11, Abstract.
Written Opinion of the International Searching Authority for corresponding PCT international application No. PCT/AU2019/050286 dated May 23, 2019.

\* cited by examiner

SUPERCONDUCTING QUANTUM INTERFERENCE APPARATUS

CROSS-REFERENCE TO RELATED APPLICATIONS

This application is the U.S. National Stage application of PCT application no. PCT/AU2019/050286, filed on 29 Mar. 2019, titled Superconducting Quantum Interference Apparatus, designating the United States the content of which is incorporated herein by reference in its entirety, PCT application no. PCT/AU2019/050286 claims priority from Australian provisional application no. 2018901053 filed on 29 Mar. 2018, the contents of which are incorporated herein by reference in their entirety.

TECHNICAL FIELD

This disclosure relates to Superconducting Quantum Interference Apparatuses, including but not limited to Superconducting Quantum Interference Filters (SQUIFs) which are arrays of a large number (more than 1,000) of Superconducting Quantum Interference Devices (SQUIDs) manufactured using high-temperature superconducting material and to improvements thereof related to the sensitivity of these apparatuses.

BACKGROUND

A Superconducting Quantum Interference Device (SQUID) is a very sensitive magnetometer and generally comprises a loop of superconducting material with one or two weak links, which are usually implemented as Josephson Junctions. The SQUID generates a voltage that depends on the external magnetic flux, which means the SQUID effectively acts as a flux-to-voltage transducer. The voltage can be measured relatively easily to obtain a measurement of the magnetic flux.

Since SQUIDs are extremely sensitive, they are used for measuring weak magnetic fields, such as the magnetic field generated by the brain, stomach and heart, for example. SQUIDs can also be used to find iron ore deposits because these metallic deposits cause a variation in the earth's magnetic field, which can be sensed using SQUIDs.

One quality measure of a magnetometer is the slope of the flux over voltage curve, which is also referred to as the sensitivity. The more the voltage changes for a particular flux change, the more sensitive the magnetometer is. While a SQUID already provides a relatively steep slope and therefore good sensitivity, this can be further improved by the use of multiple SQUIDs together. An array of a large number of SQUIDS, such as more than 1,000, with different loop areas is generally referred to as a Superconducting Quantum Interference Filters (SQUIFs) because the individual SQUID responses sum together constructively and destructively analogous to optical interference using an optical diffraction grating. However, for some applications even the largest SQUIFs are not sufficiently sensitive and there is a need to further improve the performance of SQUIF devices.

The fabrication of these devices may employ techniques described in international patent application PCT/AU2013/001074 and/or in Australian patent application AU2018903963, which are both incorporated herein by reference.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

Throughout this disclosure, the terms 'superconducting material', 'superconducting device' and the like are used to refer to a material or device which, in a certain state and at a certain temperature, is capable of exhibiting superconductivity. The use of such terms does not imply that the material or device exhibits superconductivity in all states or at all temperatures.

A superconducting quantum interference apparatus comprises an array of loops each loop constituting a superconducting quantum interference device. The array comprises multiple columns, each of the columns comprises multiple rows connected in series, each of the multiple rows comprises a number of loops connected in parallel, and the number of loops connected in parallel in each row is more than two and less than 20.

It is an advantage that keeping the number of loops in parallel below 20 improves the performance of the apparatus. This is contrary to existing knowledge where it is commonly assumed that a larger number of parallel loops would increase performance.

The number of loops connected in parallel in each row may be less than 10 and may be less than 8 and may be less than 7.

The apparatus may improve a performance selected from one or more of:
 sensitivity;
 linearity; and
 dynamic range.

Each of the loops may be of high temperature superconducting material. "High temperature" in the context of superconduction means that the material is such that superconduction occurs at temperatures that are higher than "ordinary" or metallic superconductors that usually have transition temperatures (temperatures below which they are superconductive) below 30 K (−243.2° C.) and must be cooled using liquid helium in order to achieve superconductivity. In contrast, high temperature superconducting materials have transition temperatures as high as 138K. For example, a lower limit of "high temperature" may be considered at 77K, where cooling with liquid nitrogen is feasible. One such material is yttrium barium copper oxide (YBCO) with a transition temperature of 90K. It is an advantage that high temperature superconducting material requires less complicated cooling mechanisms, consumes less power and occupies less volume. However, the manufacturing often involves epitaxial growth of the superconducting material, and the availability of high quality larger substrates for epitaxial growth can be an issue. As a result, using high temperature superconducting material it is more difficult to increase the loop size to increase sensitivity because this would increase the overall chip size. Therefore, the above apparatus has the advantage that it allows the increase in sensitivity by increasing the number of loops but with only a relatively small increase in chip size, which is particularly advantageous in high temperature superconducting materials.

Each loop may comprise two step edge junctions. Any two adjacent loops may be connected in parallel have one junction in common.

The apparatus may be a superconducting quantum interference filter (SQUIF). The loops may have loop areas that vary across the array.

The apparatus may be a superconducting quantum interference device (SQUID) array. The loops may be connected in parallel in each row and may have equal loop areas.

The columns may comprise multiple sets of columns and the columns of each set may be connected in series. The series-connected columns of a first set may be connected in parallel to series-connected columns of a second set.

The columns may comprise multiple sets of columns and the columns of each set may be connected in parallel. The parallel-connected columns of a first set may be connected in series to parallel-connected columns of a second set.

The impedance of the array may be less than or equal to 1 kΩ.

The array may comprise at least 1,000,000 loops.

The apparatus may comprise at least 1,000,000 loops, the number of loops connected in parallel in each row may be more than two and less than 20 and the number of loops connected in parallel in each row, the number of columns connected in series and the number of columns connected in parallel may be such that an impedance of the array is less than or equal to 1 kΩ and preferably equal to 50Ω so as to optimize the power delivered to an amplifier, for example.

The array may comprise a number of at least two columns connected in parallel, each of the columns may comprise multiple rows connected in series, each of the multiple rows may comprise a number of loops connected in parallel, and the number of loops connected in parallel in each row may be more than two and less than ten times the number of columns connected in parallel.

The apparatus may comprise an array of at least 1,000,000 loops each loop constituting a superconducting quantum interference device, the array may comprise a number of at least 100 columns connected in parallel, each of the columns may comprises multiple rows connected in series, each of the multiple rows may comprise a number of loops connected in parallel.

The loops may be either central biased or homogenously biased.

The array may be integrated into a semiconductor chip by forming the array on the chip.

A non-transitory, computer readable medium has computer code stored thereon. The computer code defines a quantum interference apparatus comprising an array of loops, each loop constituting a superconducting quantum interference device, wherein the array comprises multiple columns,
each of the columns comprises multiple rows connected in series,
each of the multiple rows comprises a number of loops connected in parallel, and
the number of loops connected in parallel in each row is more than two and less than 20.

A photo mask or set of photo masks defining a quantum interference apparatus comprising an array of loops, each loop constituting a superconducting quantum interference device, wherein
the array comprises multiple columns,
each of the columns comprises multiple rows connected in series,
each of the multiple rows comprises a number of loops connected in parallel, and
the number of loops connected in parallel in each row is more than two and less than 20.

An electronic chip comprising an array of loops, each loop constituting a superconducting quantum interference device, wherein
the array comprises multiple columns,
each of the columns comprises multiple rows connected in series,
each of the multiple rows comprises a number of loops connected in parallel, and
the number of loops connected in parallel in each row is more than two and less than 20.

A superconducting quantum interference apparatus comprises an array of loops each loop constituting a superconducting quantum interference device. The array comprises multiple columns, each of the columns comprises multiple rows connected in series, each of the multiple rows comprises a number of loops connected in parallel, and the number of loops connected in parallel in each row is more than two and less than 20 and the impedance of the array is less than or equal to 1 kΩ.

A method of measuring magnetic flux comprises:
exposing an array of loops each loop constituting a superconducting quantum interference device to the magnetic flux;
measuring an electric response of the array to the magnetic flux; and
determining a value indicative of the magnetic flux based on the measurement, wherein
the array comprises multiple columns,
each of the columns comprises multiple rows connected in series,
each of the multiple rows comprises a number of loops connected in parallel, and
the number of loops connected in parallel in each row is more than two and less than 20.

BRIEF DESCRIPTION OF DRAWINGS

An example will now be described with reference to the following drawings.

DESCRIPTION OF EMBODIMENTS

Figure 1:
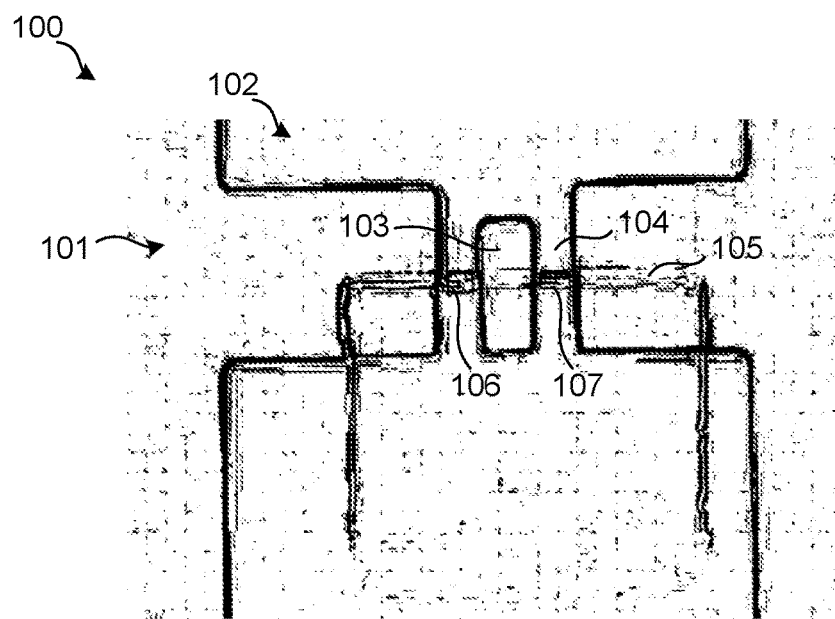
FIG. 1 is a photo of an example SQUID.

As mentioned above, a larger number of loops (SQUDs) in a SQUIF device generally improves the sensitivity of that device. It has been found, however, that the sensitivity plateaus and further increasing the number of loops does not provide the expected improvement of sensitivity. This means that it is difficult to improve the sensitivity further using conventional wisdom.

Similar considerations apply to linearity, where a larger number of loops improves the linearity of the response curve within an operating region. This may be the main purpose of increasing the number of loops in the sense that it is not required to further improve the sensitivity of existing designs but the linearity and/or the dynamic range is to be improved. This is particularly important for time-varying signals, such as RF signals because any non-linearity leads to distortion, which generally includes the generation of additional frequencies. These additional frequencies may then be mapped onto the payload frequency during sampling and/or down-mixing as the distorted signal may violate the Nyquist condition. Therefore, an improved linearity of the sensor would significantly improve the quality of the signal output, that is, reduce the noise in the signal. In other examples, the dynamic range is increased which increases the power delivered to the amp but the array should match the source impedance to minimise power losses. Dynamic range is here related to peak to peak voltage which may be proportional to N.

Further, an improved linearity also means that the response curve is sufficiently linear over a large operational range. In other words, the signal can move away around the optimal point on the curve and still be in a linear region. Without the improvement in linearity, such a signal would need to be considered as 'clipped'. With the improved linearity, however, this signal can be captured accurately, which means that the improved linearity in effect increases the dynamic range of the sensor.

It is noted that dynamic range may be defined as the peak-to-peak voltage of the anti-peak in the SQUIF response. Maximising the dynamic range may include maximising the power delivered to the connected circuitry, such as an amplifier or other 50 ohm electronics, which means maximising the number of loops N. However, it is also important to optimize the array impedance to match the source impedance within a reasonable range (such as 50 ohms).

This disclosure provides an improvement in sensitivity, linearity and/or dynamic range by reducing the number of loops that are connected to each other in parallel. In this context, parallel connection of loops means that they share the same metallisation layer and that the voltage across the loops within the same row is identical. In other words, electrical charge can flow freely across the parallel connected loops.

In order to address this problem, this disclosure provides a SQUIF structure that reduces the number of parallel connected loops while, at the same time, maintaining a large total number of loops. It is noted that a series connection of a large number of loops would be difficult to use because the overall impedance would become too high to handle for most electronics interfaces.

Description of a SQUIF

A dc superconducting quantum interference device or SQUID consists of a loop of superconducting material interrupted by two Josephson junctions, which can be thought of as weak links in the superconducting material.

SQUIDs have a cosine-like voltage response to magnetic fields and are commonly used as flux-to-voltage transformers with very high sensitivities of less than one millionth of a flux quantum, $\Phi_0=2.07\times10^{-15}$ Wb. The peak-to-peak voltage of the SQUID response can be optimized when the SQUID inductance factor, $\beta_L=2LI_c/\Phi_0\sim1$ for single SQUIDs with loop inductance, L and critical current, $I_c$. In some examples the inductance factor $\beta_L$ is less than 0.5. The periodicity of the SQUID voltage response is inversely proportional to the SQUID loop area. One and two dimensional arrays of dc SQUID loops connected in series and/or parallel may be used to improve the periodic voltage-magnetic field output and noise response compared to that of single SQUIDs.

FIG. 1 illustrates a SQUID 100 comprising an insulating substrate 101, a layer of high-temperature superconducting material 102, such as YBCO. A hole 103 within the superconducting layer 102 defines a loop 104. A step edge 105 extends across loop 104 and thereby defines a first weak link 106 and a second weak link 107. Weak links are also referred to as junctions or Josephson Junctions herein and these terms are used synonymously. The Josephson Junctions may be fabricated as step-edge junctions or using other techniques.

Figure 2:
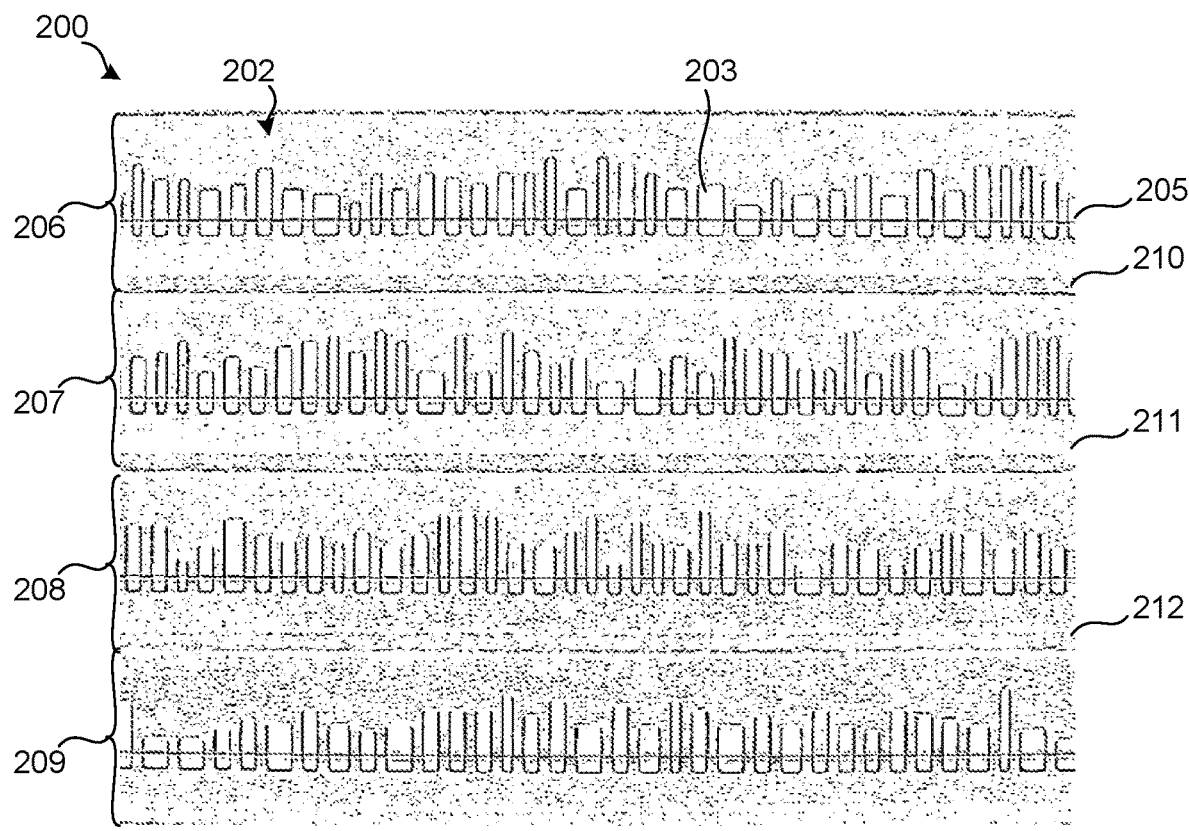
FIG. 2 is a photo of a two-dimensional (2D) SQUIF array.

FIG. 2 illustrates a two-dimensional (2D) SQUIF array 200 (simply "SQUIF" or "SQIF") also comprising a superconducting layer 202, such as YBCO, into which multiple holes, such as example hole 203 are fabricated to define multiple loops. A step edge 205 extends across multiple loops to define two junctions in each loop. Since adjacent loops share a common junction, the number of junctions is one more than the number of loops per row. In other examples, each junction has its own step edge and they may not be in line. In FIG. 2, there is a number of loops that are vertically aligned and form first row 206. There is also a second row 207, third row 208 and fourth row 209. The rows are connected to one another by metal or superconducting bars 210, 211 and 212. This means that in FIG. 2 there are four rows in series with 35 loops connected in parallel in each row, so Ns=4 and Np=35.

Arrays in which the areas of the individual SQUID loops vary throughout are called SQUIFs (superconducting quantum interference filters). For SQUIFs, the voltage response as a function of magnetic field is dominated by a steep anti-peak at zero field with weaker, aperiodic voltage oscillations at non-zero fields due to the constructive interference of the signals from all the SQUID loops of different areas, analogous to the optical interferometric processes. SQUIF arrays were originally developed for absolute magnetic field detection because the anti-peak is located at zero magnetic field.

Figure 3:
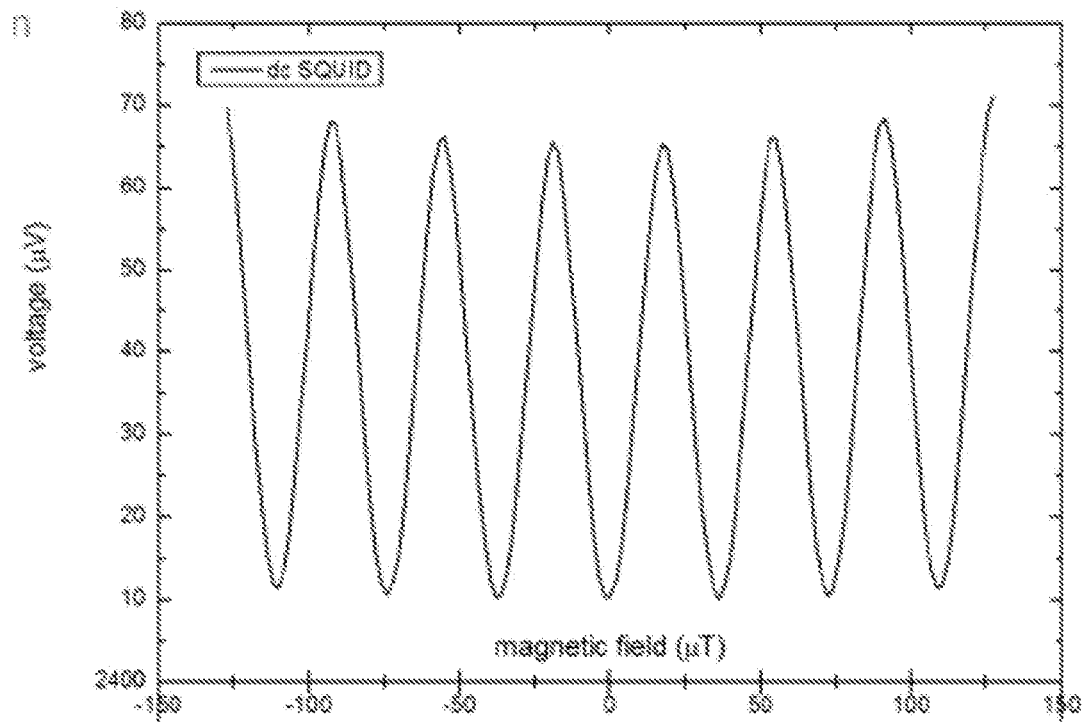
FIG. 3 illustrates the voltage response of a SQUID.
Figure 4:
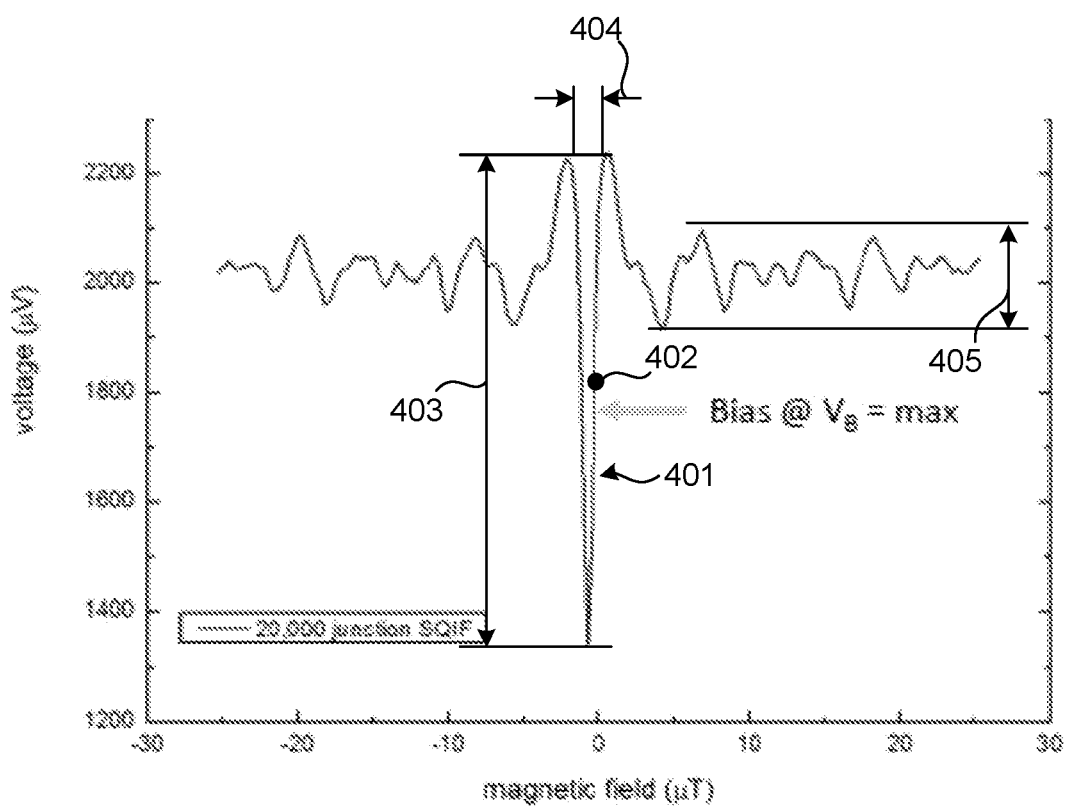
FIG. 4 illustrates the voltage response of a SQUIF array.

FIG. 3 illustrates the voltage response of a SQUID showing the periodic nature of the response. In contrast, FIG. 4 illustrates the voltage response of a SQUIF array with 20,000 junctions. Importantly, there is a deep anti-peak 401 at 0 uT. The aim would be to keep an operating point 402 where the response is closest to linear and maximally steep. In some cases this point is close to the centre of the edge of the anti-peak. This makes the magnetometer highly sensitive to small variations in magnetic flux.

A SQUIF array may have a total junction number N exceeding 20,000. This may be fabricated using YBCO step-edge junction technology as described in WO2004/015788 and WO2000/016414, which are incorporated herein by reference and which allows placing junctions almost anywhere on a substrate and take advantage of 2D designs with total junction number $N=N_s\times N_p$ the number of Josephson junctions in series and parallel, respectively.

Josephson Junctions can be implemented by forming the superconducting material over a step edge in a substrate. In particular, manufacturing process involves producing a step edge on a substrate, such as MgO or other materials. When crystalline superconducting material, such as YBCO or others, is grown on a substrate, a grain boundary barrier forms in the superconducting material where the edge has been fabricated in the substrate. This grain boundary barrier acts as the weak link forming the Josephson Junction.

The impedance of the array, Z scales as $N_s/N_p$ and therefore the array geometry can be used to match the impedance of the array to a predetermined value, if the single junction normal resistance does not vary appreciably across the array.

Figure 5:
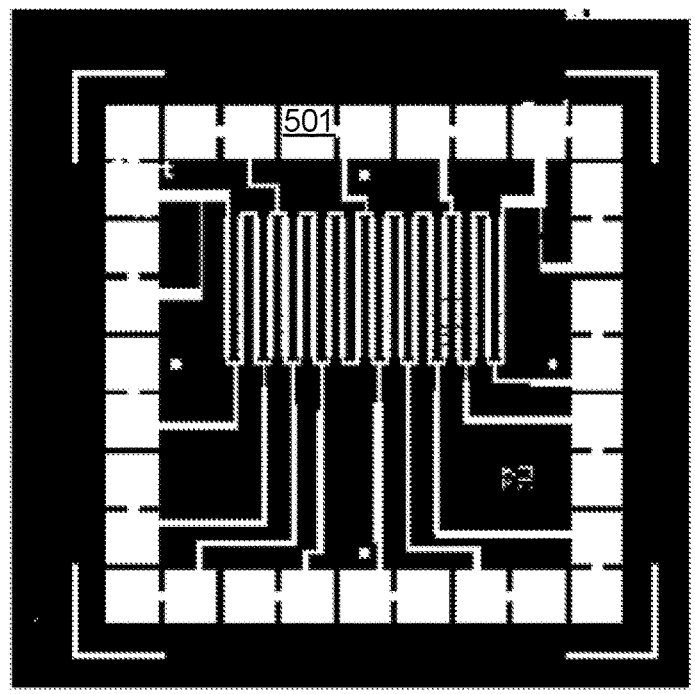
FIG. 5 illustrates an example chip design.

FIG. 5 illustrates an example chip design manufactured according to the description above and comprising a number of connection pads, such as example pad 501, and a meander structure of series connected rows of parallel SQUID loops, that is, a repetition of the structure shown in FIG. 2. Each vertical column is also referred to as a block and in this example there are 20 blocks connected in series (Nb~20) with ~1000 junction per block. The blocks are connected in series via meander lines with "u" and "n" shape connectors top and bottom of arrays. Leads can probe single blocks themselves or several in series. The whole array is measured between start and end. It was observed that sensitivity increases with number in series but the impedance does also increase.

Figure 6:
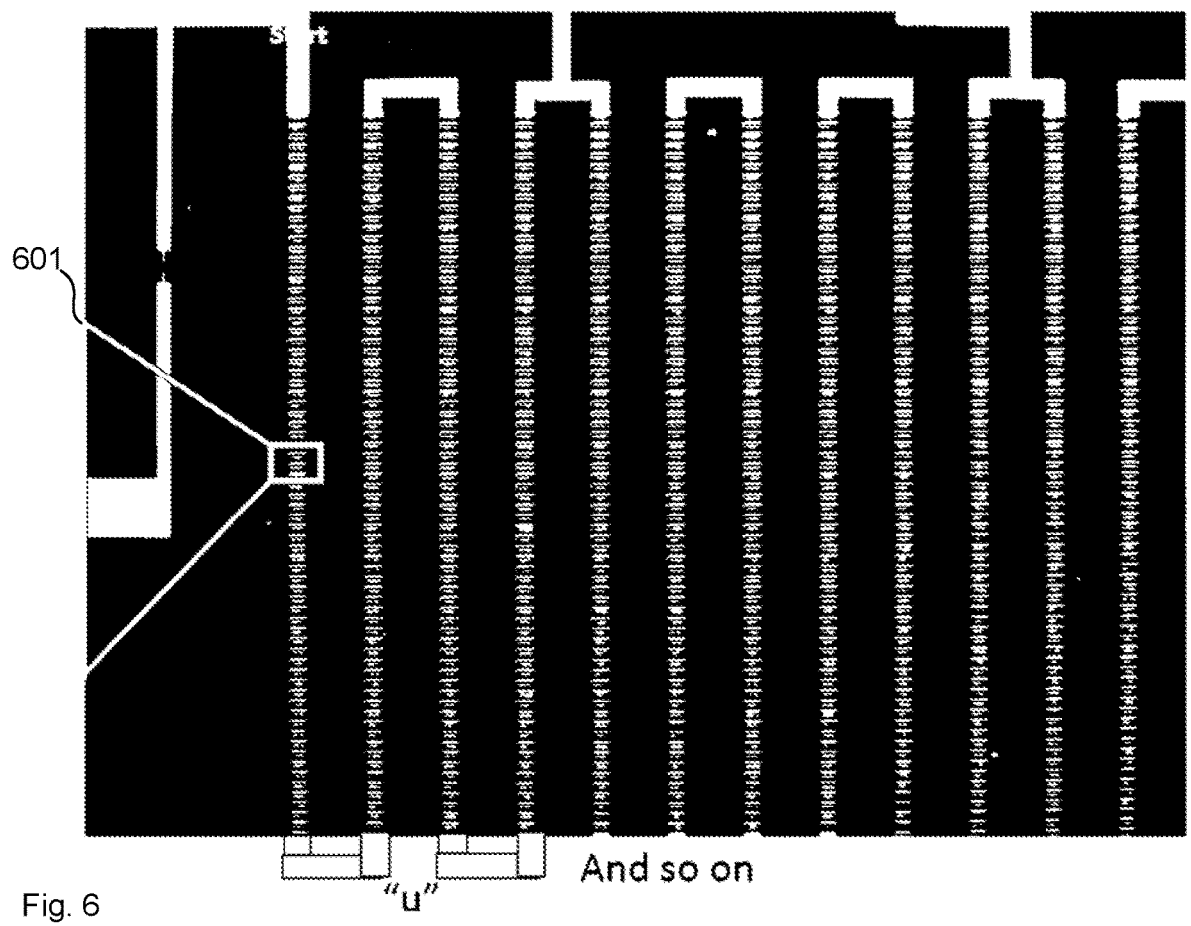
FIG. 6 is a more detailed photo of a meander structure.

FIG. 6 is a more detailed photo of the meander structure and a rectangle 601 is indicated for the following description.

Figure 7:
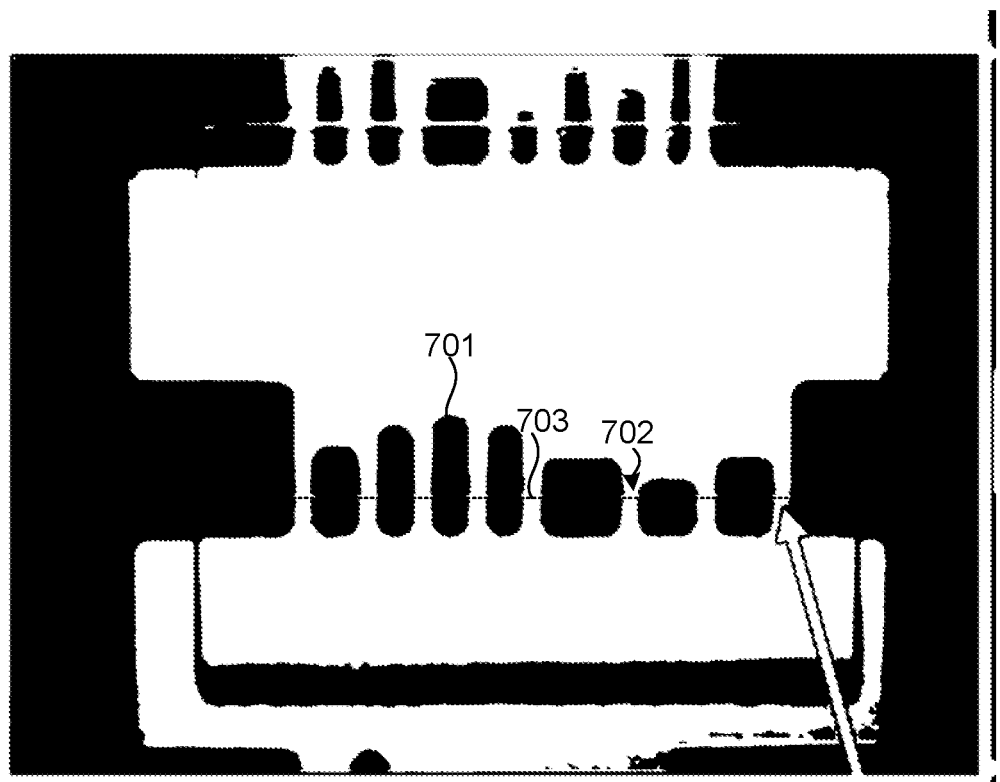
FIG. 7 illustrates the structure within the rectangle in FIG. 6.

FIG. 7 illustrates the structure within rectangle 601 in FIG. 6 comprising holes, such as hole 701 defining loops including junctions, such as junction 702, formed by a step edge 703 crossing the loops. In this example, the number of loops is seven and the loop areas vary across the row.

Figure 8:
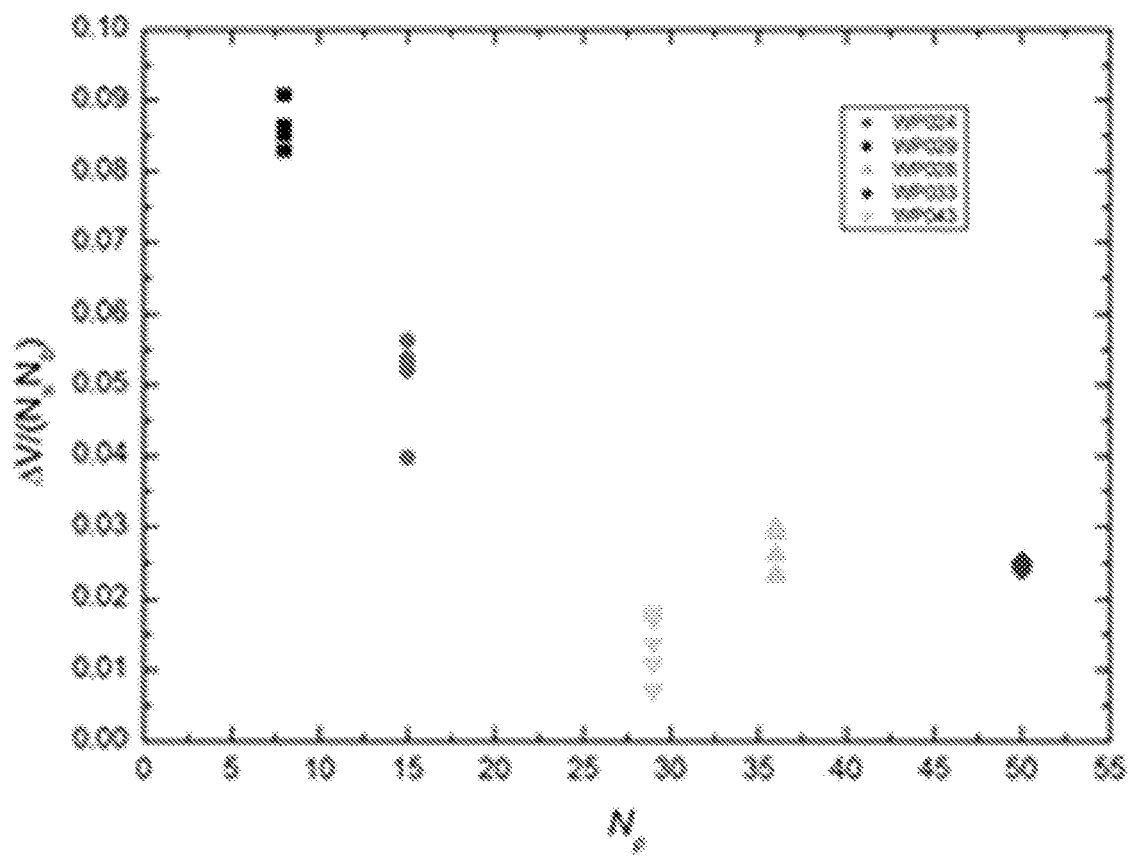
FIG. 8 illustrates the peak to peak voltage normalized to the number of junction in series.

FIG. 8 illustrates the peak to peak voltage normalized to the number of junction in series. This shows that the sensitivity generally increases with a decrease in the number of parallel loops.

Predictions of SQUIF Performance

Returning back to FIG. 4, the parameters of interest include the peak to peak voltage $\Delta V$ 403, the sensitivity or maximum slope of the anti-peak $V_B=dV/dB$ (not shown), the anti-peak width $\Delta B_{ext}$ 404, and the range of the small-amplitude oscillations at non-zero field $\delta V$ 405. The voltage noise $S_V$ and magnetic field noise $S_B$ of SQUIFs can also be measured.

Good SQUIF responses may be achieved by incommensurate loop sizes, in which every loop is a different area and avoid parasitic magnetic flux. Additionally, they following parameters were identified [see V. Schultze, R. IJsselsteijn and H-G Meyer, Supercond. Sci. Technol. 19 (2006) S411S415, which is incorporated herein by reference]:

$\Delta V \propto N_s$
$\Delta B_{ext} \propto 1/N_p$
$dV/\Delta V \propto 1/(N_s N_p)$
$dV/dB \propto N_s N_p$
$S_V \propto (N_s N_p)^{0.5}$
$S_B \propto 1/(N_s N_p)^{0.5}$
$Z \propto N_s/N_p$ This means that the voltage output from arrays is expected to scale with $N_s$, the number of Josephson junctions in series whilst the anti-peak width is expected to decrease with an increasing number of loops in parallel, $N_p$. Therefore as the total number of loops N increases, the sensitivity (dV/dB) should also increase proportionally.

Characterization of 2D SQUIF Arrays With Different Aspect Ratios

A study was performed on 2D SQUIF arrays which had the same total number of junctions in the array (N=20,000) consisting of 20 blocks of 1,000 junctions in each. This set of arrays looks at the effect of changing the number of junctions in parallel and series but maintaining the same N.

Figure 9A:
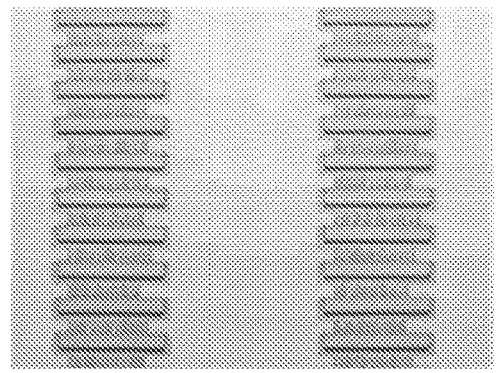
FIGS. 9*a*, 9*b* and 9*c* are photos of parts of three SQUIF arrays with increasing numbers of loops in parallel.
Figure 9B:
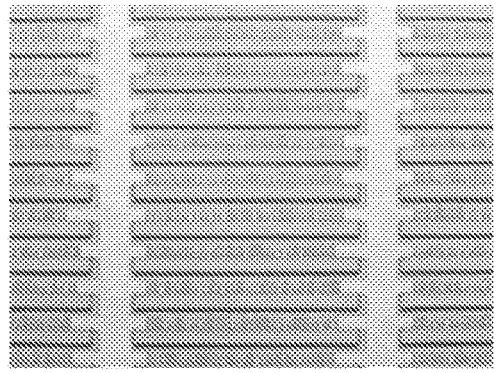
Figure 9C:
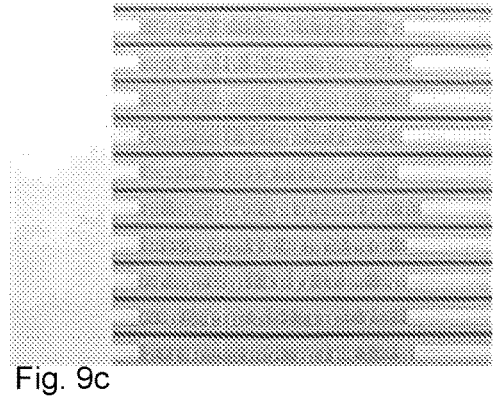

FIGS. 9a, 9b and 9c are photos of parts of three SQUIF arrays with increasing numbers of loops in parallel; $N_p$=14 (FIG. 9a), 35 (FIG. 9b) and 50 (FIG. 9c). As $N_p$ increases, $N_s$ was decreased to keep the total N similar. The results indicate that a larger anti-peak occurs when $N_p$ is smaller.

Similar data from additional arrays in this set were measured and is summarized in FIG. 8 where $N_p$=7 to 50 is plotted. This data is the peak-to-peak voltage normalized to the number of junctions in series. The data is plotted this way to remove the effect of $N_s$ on sensitivity which does improve the SQUIF sensitivity. By plotting the data this way we can look at the effect of $N_p$ only on the 2D SQUIF sensitivity. There appears to be a dip in sensitivity around $N_p$~30, but this is likely to be due to inter-chip variations in junction parameters, which are larger than intra-chip variations.

The data in FIG. 8 shows that as the arrays become wider, the sensitivity seems to decrease, which is not what was originally predicted.

Figure 10:
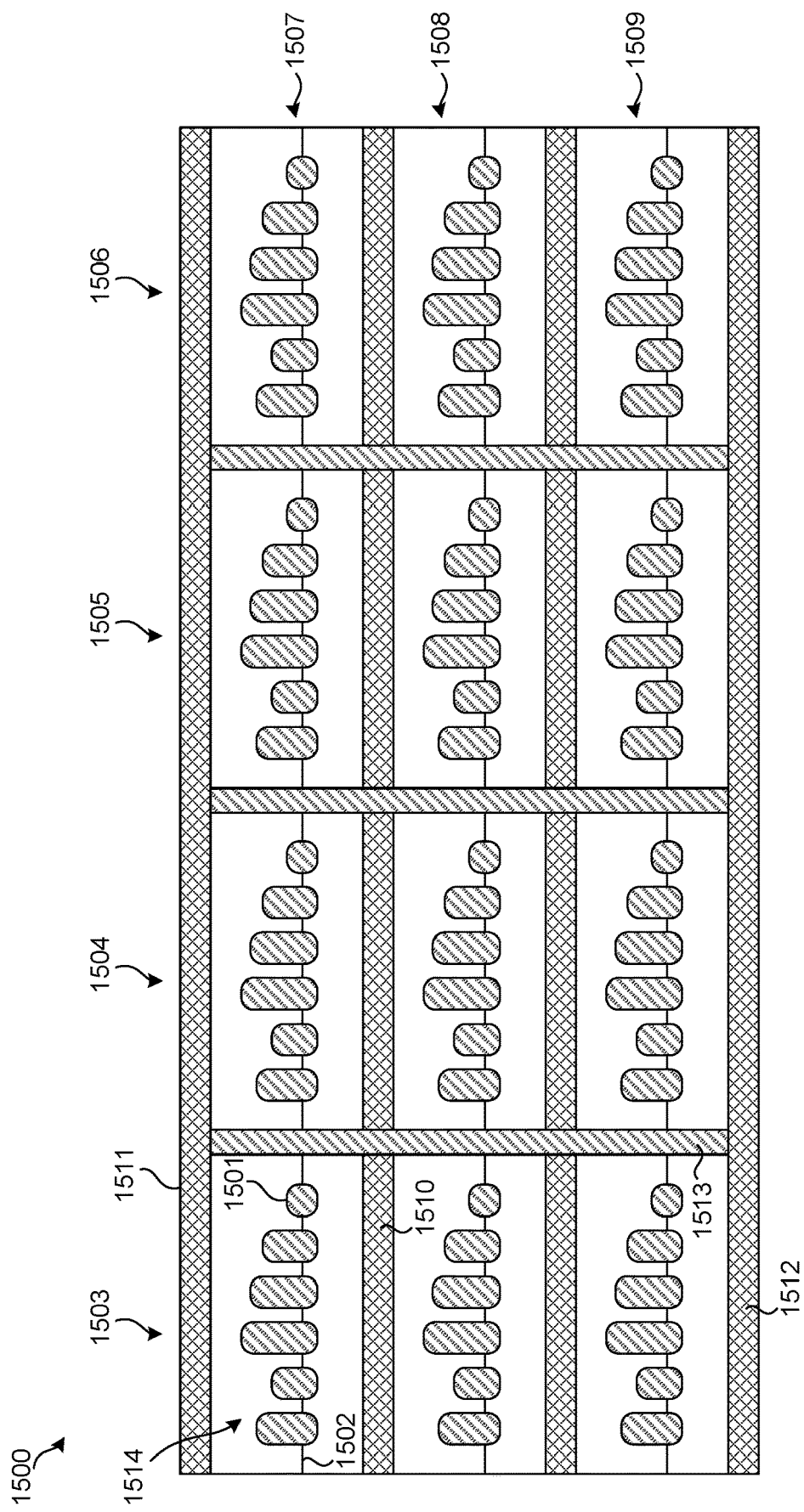
FIG. 10 illustrates another example of a superconducting quantum interference filter (SQUIF).

FIG. 10 illustrates another example of a superconducting quantum interference filter (SQUIF) comprising an array (at reference numeral 1500) of loops, such as 1501, crossed by a step edge 1502. Each of the loops constitutes a superconducting quantum interference device. The array 1500 comprises multiple columns 1503, 1504, 1505 and 1506. Each of the columns 1503, 1504, 1505 and 1506 comprises multiple rows 1507, 1508 and 1509 connected in series. That is, the rows of one column are connected by metal or superconducting bars or other connections, such as 1510. Each of the multiple rows 1507, 1508 and 1509 comprises a number of loops, such as loop 1501, connected in parallel. The number of loops connected in parallel in each row is low to improve the sensitivity of the SQUIF as explained above, which means the number is chosen contrary to the current idea of increasing the number of parallel loops to increase sensitivity.

In the example of FIG. 10, there are six loops connected in parallel, which form seven junctions. Parallel connection of loops in this example means that the loops share the same layer of superconducting material, which is indicated as white fill in FIG. 10. The columns 1503, 1504, 1505 and 1506 are connected in parallel. For example, column 1503 is connected to 1504 by metal bars 1511 and 1512 at either end of the row. In fact, metal bars 1511 and 1512 connect all four columns in parallel. However, the loops of adjacent columns are isolated from each other. For example, there is a gap in the superconducting layer between the columns which defines an area of isolating substrate 1513 that separates the columns from each other. As a result, charge carriers, such as electrons can flow freely across the parallel connected loops of one column but cannot flow across to a different column. In effect, this splits the overall arrangement of loops into a number of separated columns that are connected in parallel. This achieves the desired large number of loops while keeping the impedance due to series connected loops low.

An intersection of a row with a column may also be referred to as a cell and an example cell 1514 is indicated in FIG. 10. It is noted that it is not necessary that the number of loops is identical for all cells. That is, there may be cells with more loops and cells with less loops. For example, there may be wider columns and narrower column or the number of loops may vary between cells of the same column. In other examples, however, each cell has an identical number of loops. As mentioned above, the loops may have different loop areas and the loop areas may be distributed according to a statistical or random distribution. Also, each cell and column may have a different distribution of loop areas or different random samples of the same distribution. In other examples, the loop areas are identical for all loops.

In one example, the number of loops connected in parallel in each row is more than two and less than 20 or less than 10. In a further example, the number of loops connected in parallel in each row is less than 8 or even less than 7. In some cases the number of loops may be as low as 2.

Figure 11:
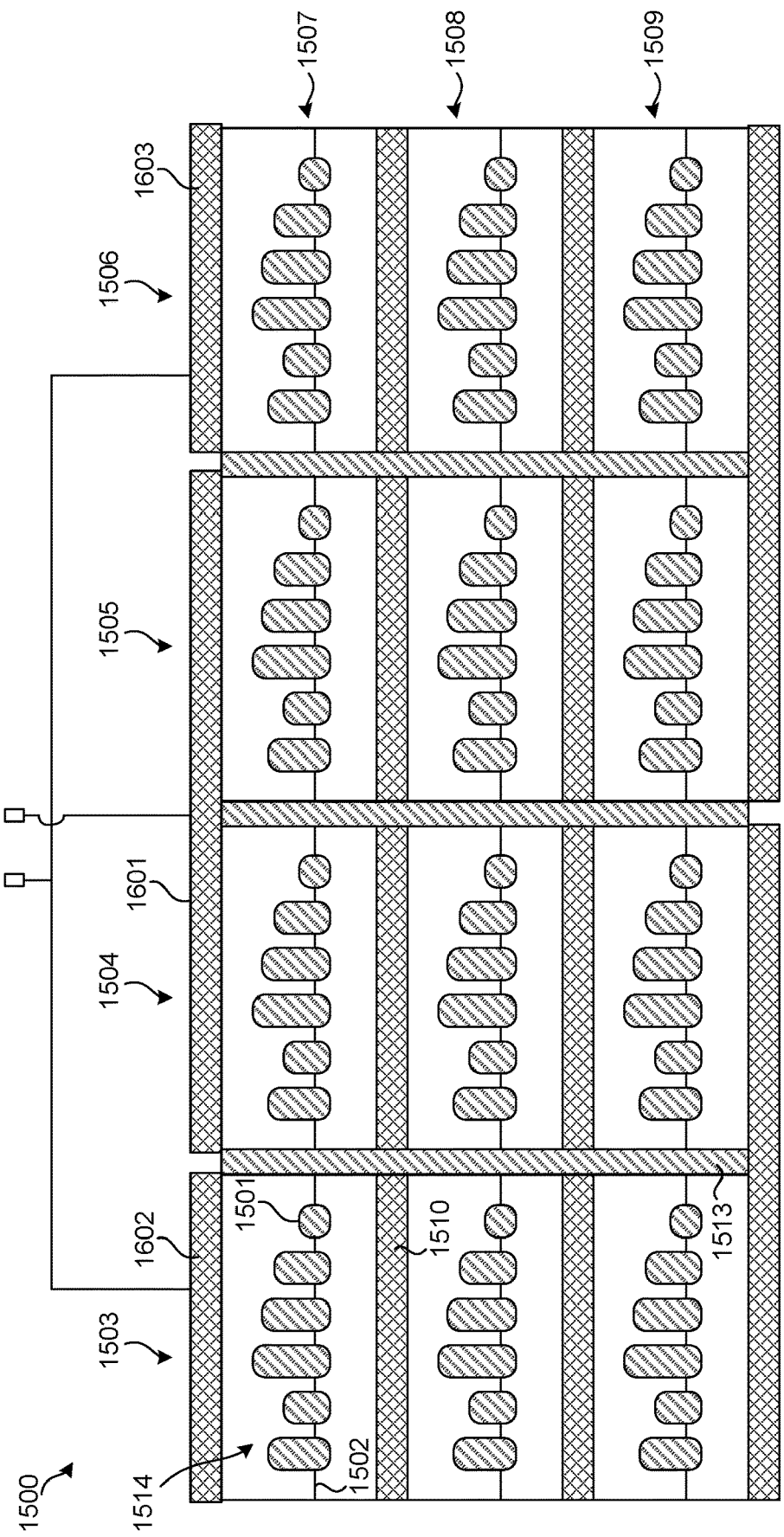
FIG. 11 illustrates a further example with two folded parallel connected columns.

In some examples the SQUIF array may comprise at least 1,000,000 loops in total distributed over the columns and rows of the array. It is possible that some columns are connected in series to implement longer series connections. An example is shown in FIG. 11 where columns 1503 and 1504 form a first set of columns and are connected in series and columns 1505 and 1506 form a second set of columns and are also connected in series. Both resulting 'double-columns' are connected in parallel. That is, double-column 1503/1504 is connected in parallel to double-column 1505/1506 when the device is connected at terminal 1601 and 1602/1603 as shown. In other words, the longer columns are folded into the array structure to achieve a more compact design closer to a square design, which is easier to manufacture than a very long chip.

Figure 12:
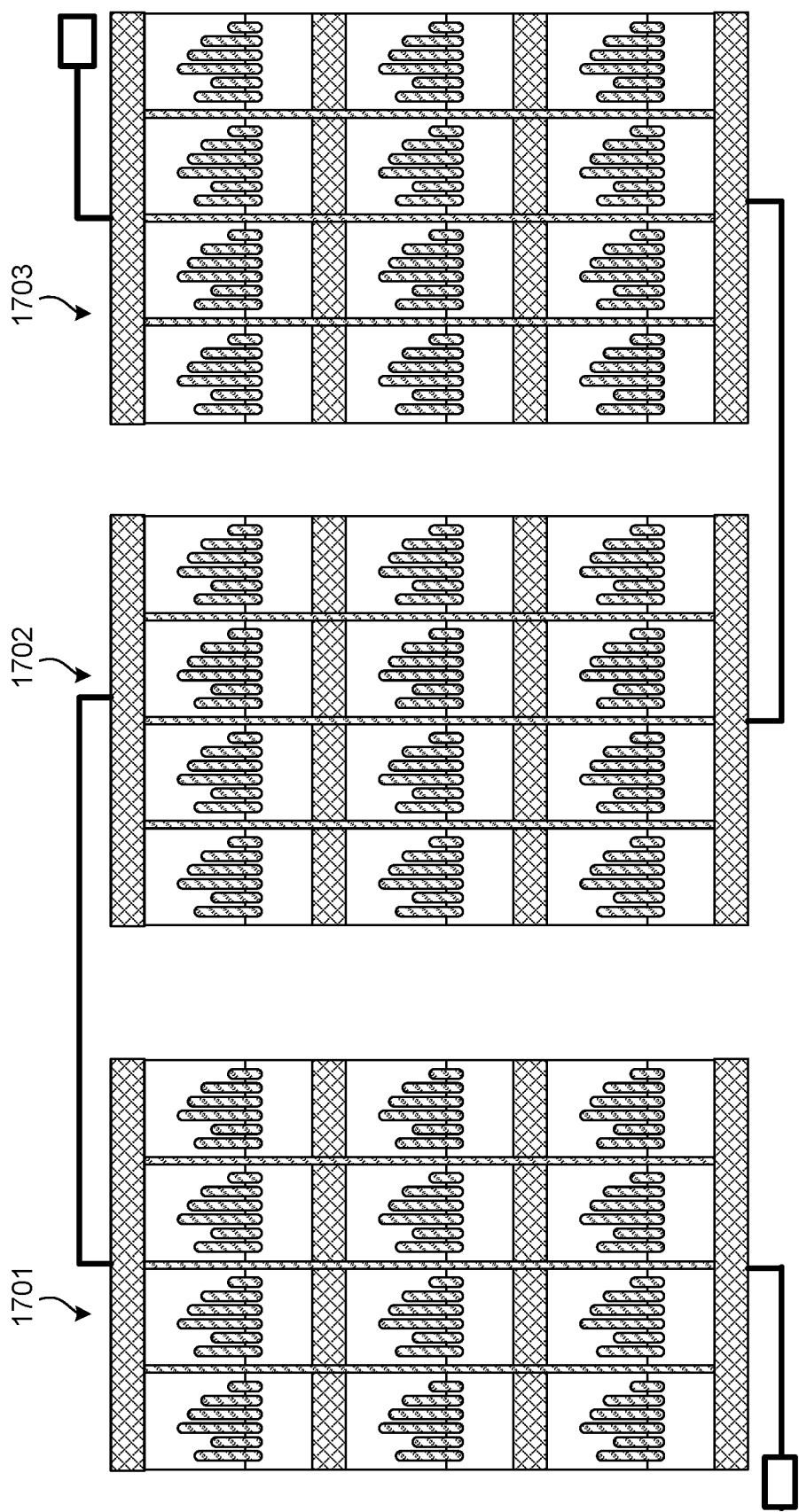
FIG. 12 illustrates a further example with two folded parallel connected columns.

FIG. 12 shows another example of 3 blocks (i.e. sets) 1701, 1702 and 1703 connected in series and each of the blocks (sets) has 4 columns connected in parallel and in each column there are 6 loops connected in parallel. This has a lower impedance than 12 columns in series but a comparable sensitivity.

Figure 13:
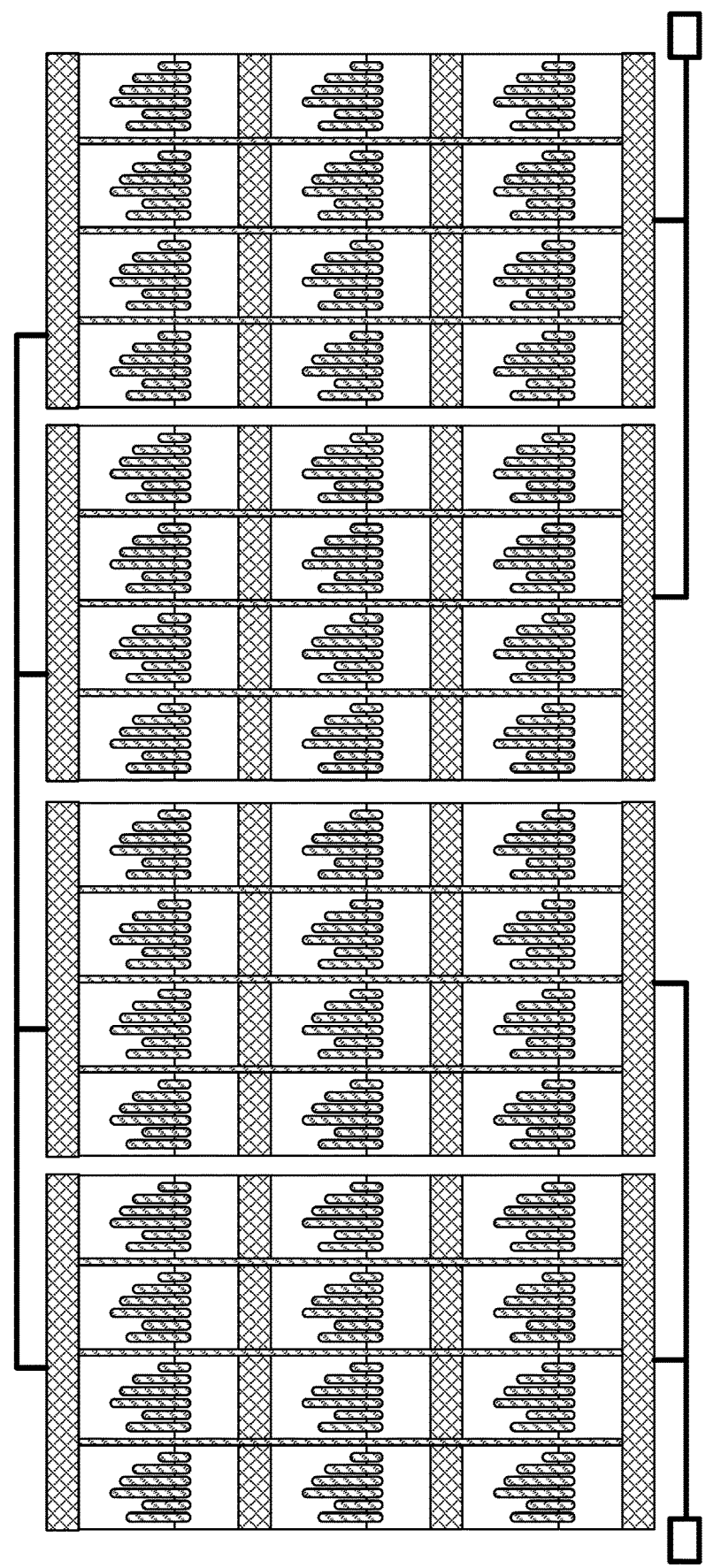
FIG. 13 illustrates a further example of a series/parallel connection of four four-column blocks.
Figure 14:
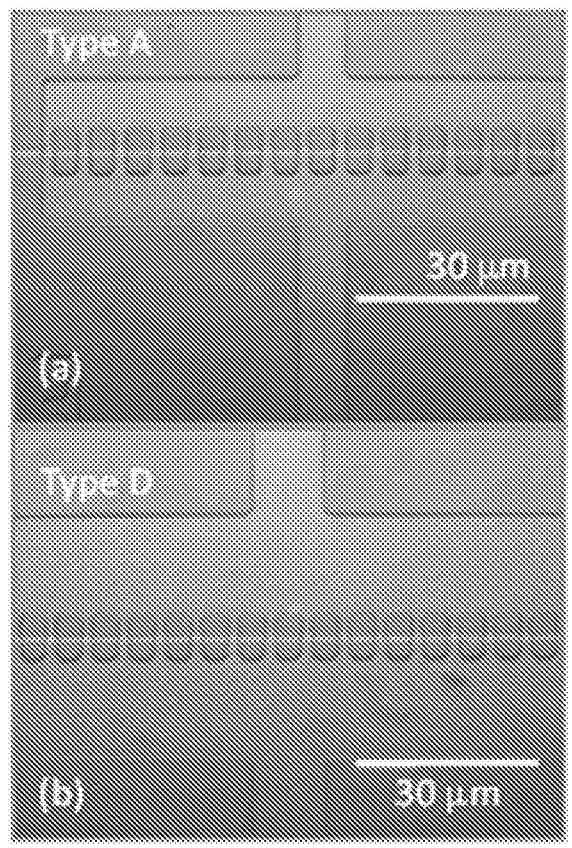
FIG. 14 shows photographs of sections of 1D parallel arrays using YBCO step-edge junctions inner loop areas given by 4 µm×8 µm.

FIG. 13 illustrates a further example of a series/parallel connection of four four-column blocks. The number of parallel connected loops in any one column remains at 6 while the number of series connected loops overall also remains at 6 but the total number of loops is 48.

In some examples, the SQUIF may be designed to achieve a particular desired impedance. In that case, the number of loops in series is chosen to achieve the desired impedance and then the number of series connected loops is kept small, such as 20, to achieve a deep and linear voltage response anti-peak together with a desired total number of loops. For example, for a total number of loops of 1,000,000, 20 loops in parallel and 1,000 loops in series for the desired impedance, there would be 50 parallel connected columns. As described above, each column may be folded several times. For example, 250 loops may fit into the height of the chip which means there would be 4 series connected columns to form one of the parallel connected columns. In other words, the SQUIF comprises at least 1,000,000 loops, the number of loops connected in parallel in each row is more than two and less than 20 and the number of loops connected in parallel in each row, the number of columns connected in series and the number of columns connected in parallel is such that an impedance of the array is less than or equal to 1 kΩ or any other desired impedance value, such as 50Ω.

In yet another way of looking at the design parameters, the array comprises a number of at least two columns connected in parallel. Each of the columns comprises multiple rows connected in series. Each of the multiple rows comprises a number of loops connected in parallel. The number of loops connected in parallel in each row is more than two and less than ten times the number of columns connected in parallel. Various different options are provided in the table below:

| Number of parallel columns | Number of parallel loops less than |
|---|---|
| 2 | 20 |
| 3 | 30 |
| 5 | 50 |
| 10 | 100 |
| 100 | 1,000 |

In yet another example of designing the array, the SQUIF comprises an array of a large total number of loops, such as at least 1,000,000 loops, that each constitutes a superconducting quantum interference device. Each of the columns comprises multiple rows connected in series and each of the multiple rows comprises a number of loops connected in parallel. In that case, the array comprises a number of at least 100 columns (may be folded) connected in parallel in order to keep the number of parallel connected loops low. The number of columns may be 1,000 or 10,000. In yet another example, the number of columns is the total number of loops divided by the number of series connected loops that lead to a desired impedance and divided by 30 (or 20, 10, 8 or 7).

While some examples described herein relate to SQUIF devices with varying loop areas, constant area SQUID arrays may also be used in relation to the described concepts such as magnetometers. They may use Nb/AlOx/Nb, HTS, LTS and MgB2 junctions in the SQUID arrays which may have more reproducible parameters and can include more than 10,000 SQUIDs.

One reason the single anti-peak is of interest may be that in SQUID measurements of magnetic field, there can be an issue that during measurements using feedback control the SQUID can "jump" from one of the sine waves to another (this is called Loosing Lock) due to sudden increases in magnetic field from a range of sources, also referred to as "flux jumps" which leads to deterioration of measurements and the device needs to be warmed up and re-cooled to "reset" it. If there are no other equal magnitude Voltage oscillations nearby, as is the case for SQUIFs with one main anti-peak, then it is much more noticeable that the SQUID has lost lock. So, if arrays are used to increase sensitivity for RF detection, then it may be preferable to use a SQUID array, if it provided better sensitivity than a SQUIF array. The reason for not using a SQUID array here is that the SQUIF anti-peak should be larger (giving larger dynamic range) and also be more linear over a larger range at its maximum slope, compared with a SQUID array that should be just another sine wave (larger peak to peak) due to summation of many similar sine waves. A feedback may be used to linearize a single SQUID response but this also limits the dynamic range. SQUID arrays are also more susceptible to noise due to the more rounded sinusoidal voltage response to magnetic fields. This means a more aggressive feedback loop can be used with a SQIF array (which may also reduce bandwidth).

It is noted that the description above relates to high-temperature superconducting material, such as YBCO which may lead to a single junction normal resistance of 5-10 ohms. However, other material, such as low-temperature superconducting materials and others may equally be used. Likewise, other junction types used for YBCO or other HTS materials may equally be used.

EXAMPLES

The voltage-magnetic field response of several one-dimensional (1D) parallel arrays of high-temperature superconducting (HTS) SQUIDs were measured as a function of the number N=4-81 Josephson junctions in parallel. SQUID arrays with equal loop areas were measured experimentally. The sensitivity of the arrays generally decreased as the number of junctions in parallel increased, contrary to the predictions of standard models. A full theoretical description was developed to describe 1D parallel HTS arrays in an applied magnetic field, by extending the model for a single DC SQUID to multiple loops in parallel including the flux generated by currents circulating through all loops in the array. Calculations were performed for SQUID arrays with no variations in loop areas and for arrays with a range of loop areas, otherwise known as superconducting quantum interference filters (SQIFs). The model used parameters relevant to HTS arrays, including typical values for HTS Josephson junction parameters, such as critical current and normal resistance and their known large statistical variations (30%). The effect of the location of the current biasing leads was also explored through the calculations. This model shows good agreement with experimentally measured 1D arrays of different geometries and highlights the importance of the geometry of the current biasing leads to the arrays when optimizing the array response.

To address the issues associated with scaling of HTS SQIF and SQUID array sensitivity, this disclosure investigates the sensitivity of small 1D parallel SQUID arrays and SQIF arrays with N=3-81 junctions, both experimentally and theoretically. In particular, the effect on the array sensitivity due to increasing the number of junctions in parallel in a 1D array, as well as the effect of the current biasing scheme on the SQIF sensitivity. These HTS SQIF arrays are based on thin-film YBCO step-edge junctions on MgO substrates. Calculations are derived by considering flux threading each loop in the array due to the currents flowing around the individual array loops and the applied magnetic field, extending models that are used to calculated the voltage-field performance of a single dc SQUID. Statistical spreads in junction parameter characteristic of HTS junctions are considered in the model together with and a range of SQUID loop areas (inductances) and distributions.

Array Design, Fabrication and Measurement

Small 1D SQUID and SQIF arrays based on YBCO step-edge Josephson junctions were fabricated lithographically by growing epitaxial thin films (~100-200 nm) of YBCO on 1 cm² substrates of MgO substrates which have steps etched into their surface using an established technique based on argon ion-beam milling [Foley et al. 1999]. Grain boundaries form in the YBCO film, deposited using e-beam evaporation, at the top edge of the MgO step creating Josephson junctions. The films are then fabricated into various 1D junction array designs with 2 μm wide step-edge Josephson junctions. The number of junctions in parallel, $N_p$ increased from 4 to 81 and were fabricated on the same substrate. This corresponded to $N_p-1$ SQUID loops in each array; the example in FIG. 1 has $N_p=10$ junctions, and therefore 9 SQUID loops in parallel.

Two sets of 1D SQUID arrays with equal loop areas (SQUID loop holes were w=4 μm wide and h=8 μm high) with increasing numbers of loops in parallel were fabricated and measured with the first set having $N_p=4, 6, 11, 21, 31$ and second set having $N_p$=8, 16, 51, 81. The different sets of were designed to investigate experimentally the effect of current biasing geometries. Each array had a single current biasing lead located approximately at the centre of the array and the arrays were all fabricated on the same MgO substrate with the same YBCO film.

Current-voltage (I-V) and voltage-magnetic field (V-B) characteristics where measured for all arrays, using the standard four-terminal method, at 77 K by cooling the arrays on a measurement probe in a dewar of liquid nitrogen with five layers of mu-metal shielding to screen out the earth's magnetic field. The critical current, $I_c$ and normal resistance, $R_{na}$ of the arrays were determined from the I-V characteristic by fitting a straight line to the I-V data at currents greater than five times the $I_c$. The slope of the line and the y-intercept were used to calculate $R_{na}$ and $I_c$, respectively. The inductance factor, $\beta_L=2L_sI_c/\Phi_0$ of the arrays was determined from the single SQUID loop inductance, $L_s$ (which includes both the geometric and the kinetic SQUID inductance) determined using FastHenry and the average junction critical current $I_c$.

Experimental Results

As a way of improving the sensitivity of larger SQUID and SQIF arrays so that their sensitivity scales proportionally to their single SQUID equivalent voltage modulations [Schultze et al. 2006], this disclosure investigates geometries based on 1D parallel arrays equal loop area SQUID arrays. Loop areas (inductances) ensure that $\beta_L<1$. Here we report on voltage-magnetic field (V-B) measurements of 1D parallel arrays of SQUIDs with an increasing number of junctions in parallel with $N_p$=4 to 81.

Figure 15A:
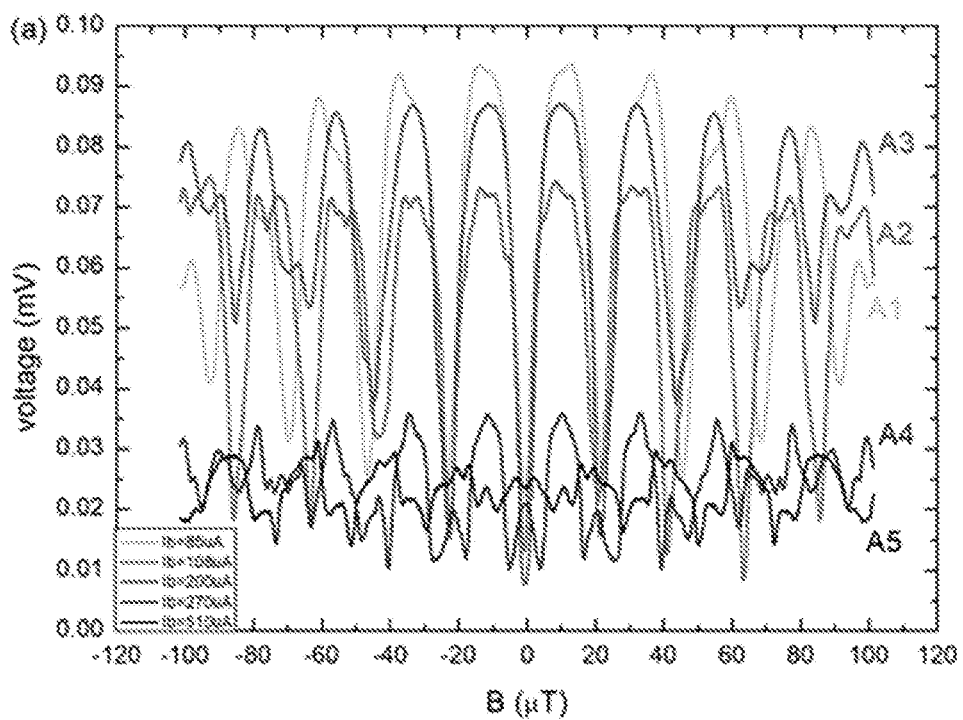
FIGS. 15a and 15b illustrate a voltage-magnetic field response for 1D equal loop area arrays for arrays with (a) $N_p$=4, 6, 11, 21 and 31 junctions in parallel and (b) $N_p$=8, 16, 51 and 81 junctions in parallel.
Figure 15B:
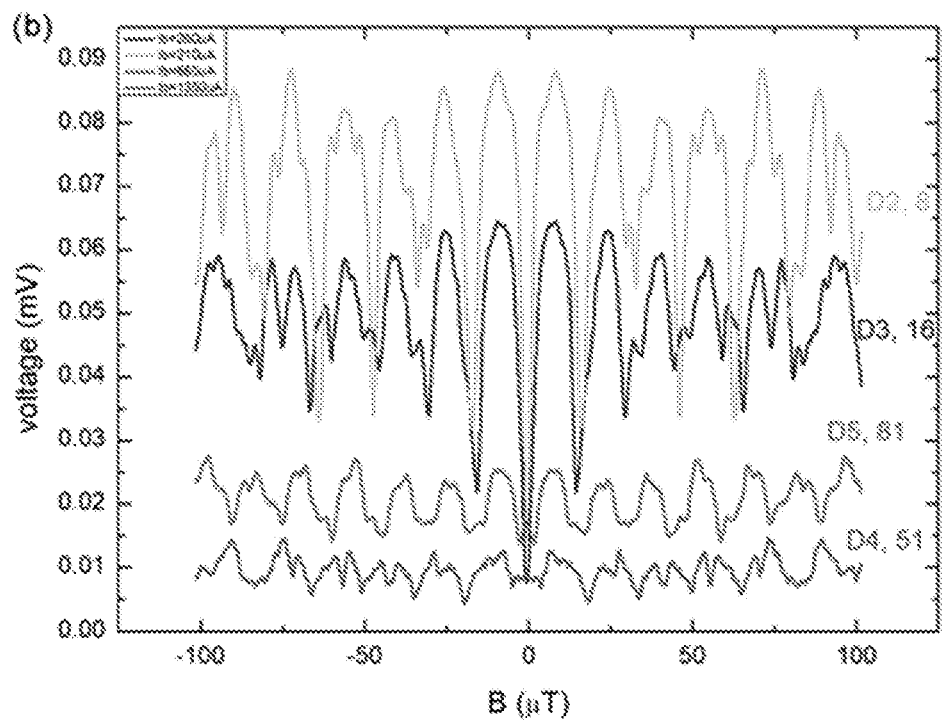

The voltage-magnetic field response of the five Type A and four Type D arrays are shown in FIGS. 15a and 15b, respectively. For each measurement of an array, the bias current $I_b$ was chosen to maximise the voltage modulation.

For arrays with smaller values of $N_p \le 16$, the V-B responses are dominated by large oscillations whose peak to peak voltages ($V_{p-p}$) are modulated within a larger period envelope function, with some smaller period oscillations superimposed. The dominant period of the narrower arrays relating to $\Phi_0$ was ~20 µT for the first set and 14.9 µT for the second, which correspond to effective loop areas of 104 µm² (139 µm²), respectively according to $\Phi=B\cdot A_{eff}$. These affective areas are close to the predicted values of $A_{eff}$=96 µm² and 144 µm². As $N_p$ increases the anti-peak at zero field decreases in amplitude and the maximum slope either side decreases, meaning poorer sensitivity. In addition, the periodicity of the wider arrays degrades for $N_p>16$ in FIGS. 21a and 21b. For arrays with $N_p$=51, 81 the main anti-peak has disappeared all together, and the higher field oscillations have multiple features convoluted with the main period.

Figure 16:
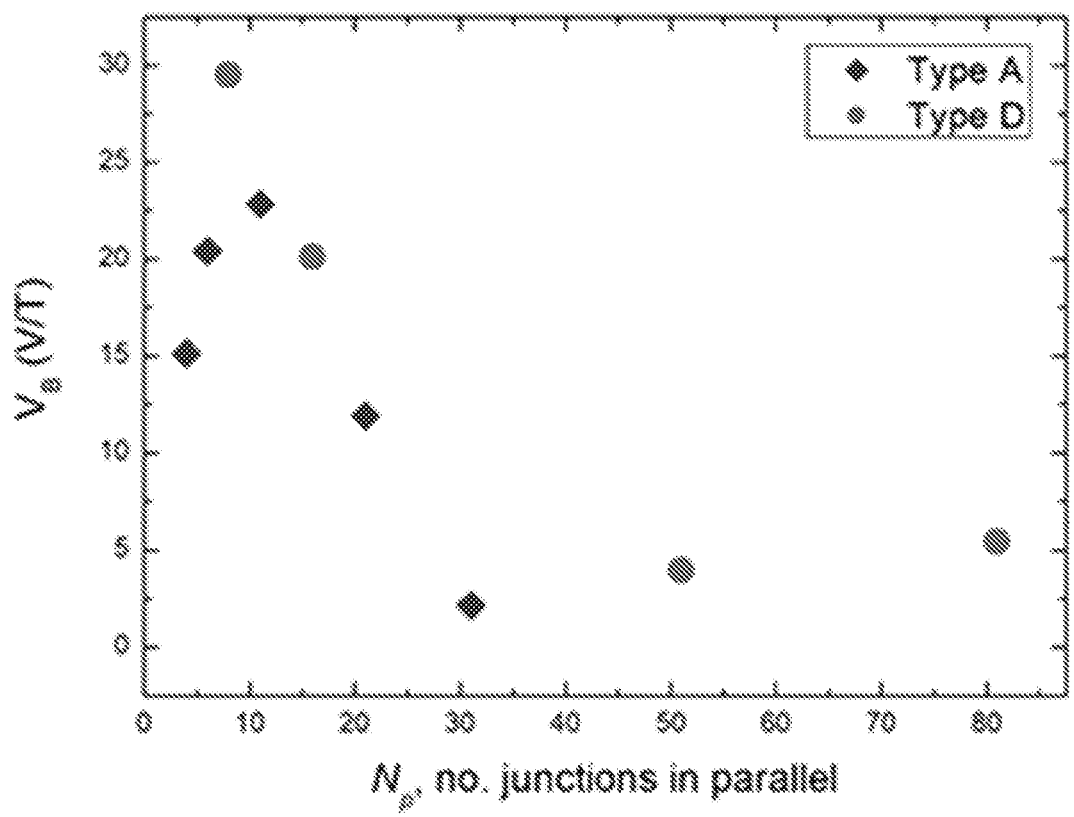
FIG. 16 illustrates a maximum sensitivity (dV/dB) measured for two sets of 1D SQUID arrays (all with the same SQUID hole area) as a function of $N_p$ the number of junctions in parallel. Square data and circular data represent different sets of arrays covering different values of $N_p$.

The sensitivities for all arrays were determined as the maximum slope of the V-B curves close to zero field. For arrays with $N_p>20$, the maximum sensitivity was not necessarily close to zero field due to the absence of a notable anti-peak at zero field. For these longer arrays, the sensitivity recorded was instead obtained from the slope of the V-B curves close to the same anti-peak position as measured for the shorter arrays. A summary of the 1D array sensitivity (dV/dB) for both sets of arrays as a function $N_p$ are shown in FIG. 16. The square data points (first set) show a maximum sensitivity for the 1D arrays with around $N_p$=10 junctions, whilst the circular data points represent (second set) show a continuous decrease in sensitivity as $N_p$ increases. In both cases, for $N_p>10$ the array sensitivity decreases in noting that $N_p$=20 may provide a useful sensitivity for some applications. The reduction in sensitivity as the array width increases is most likely due to the large field effects which arise due to the larger superconducting shielding currents circulating around the arrays, which couple excess flux into the arrays, when they are biased optimally.

Theoretical Modelling

Figure 17A:
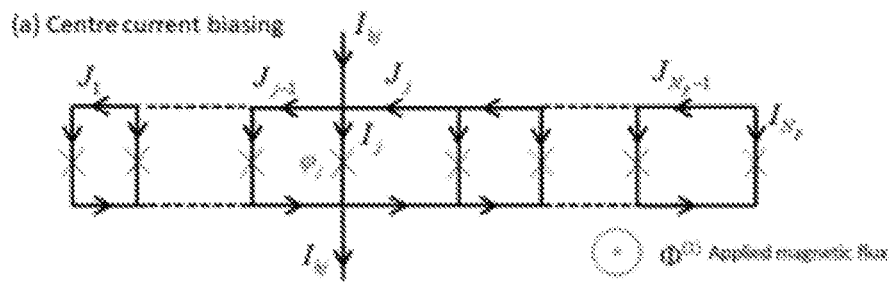
FIGS. 17a and 17b illustrate a schematic of 1D parallel SQIF arrays with $N_p$ junctions and $N_{p-1}$ loops in parallel in a perpendicular applied magnetic field. Crosses represent Josephson junctions, with phase $\phi_j$. The currents around the $j^{th}$ loop are split into horizontal ($J_j$) and vertical components ($I_j$), the latter flowing through the junctions. Two different biasing schemes are studied in which the bias current is centre biased via one lead into and out of the array in FIG. 23a, or homogeneously biased through all loops in FIG. 23b.
Figure 23A:
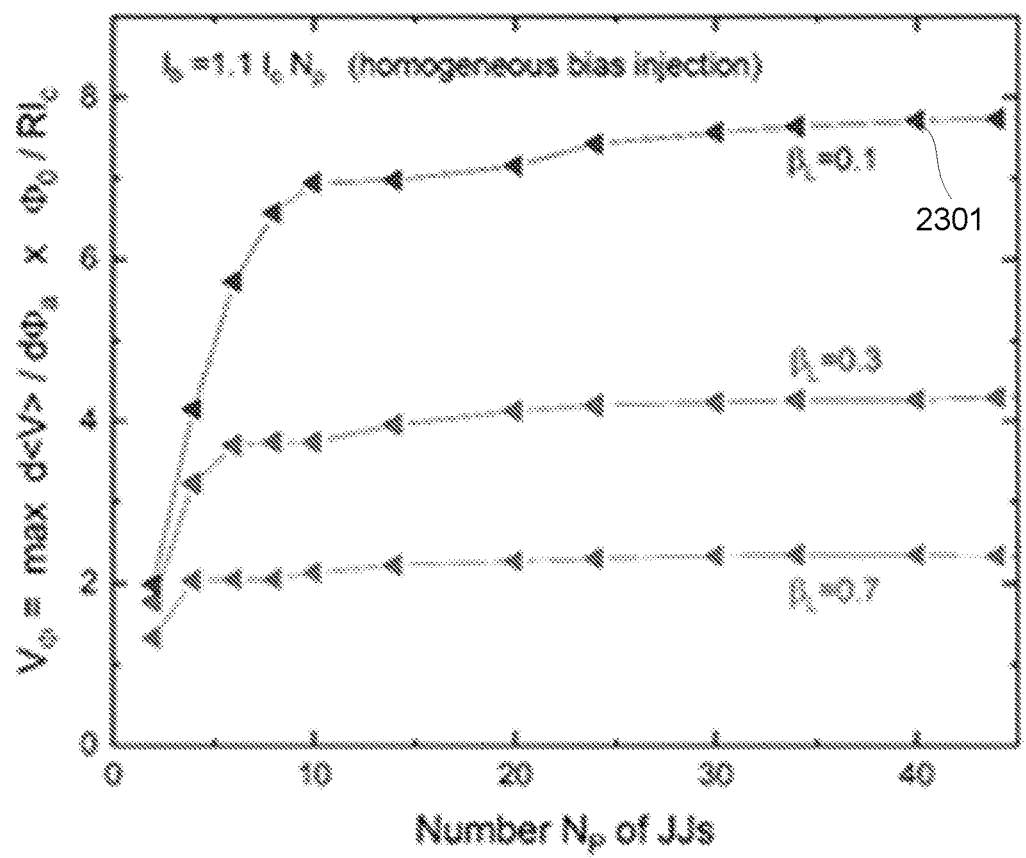
FIGS. 23a and 23b illustrate theoretical values of the maximum normalized sensitivity $|V_\Phi|_{max}$ for 1D equal loop area SQIF arrays with no spread in $\sigma_{Ic}$, $\sigma_R$, $\sigma_A$ and with increasing $N_p$ and three values of $\beta_L$=0.1, 0.3 and 0.7. The arrays are biased either (a) homogeneously with 1.1$I_c$ or (b) centrally with 1.1$N_pI_c$.
Figure 23B:
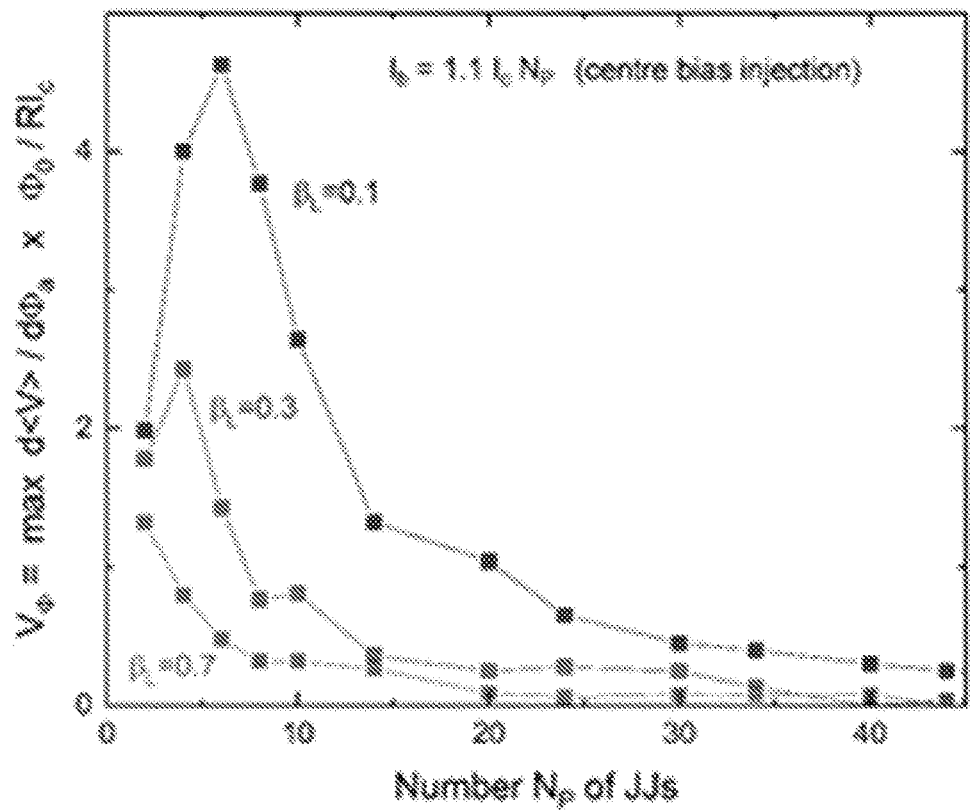

The model developed here describes 1D arrays assuming HTS material parameters. It begins with previous models [Tesche & Clarke 1977] that describe a single DC SQUID with two Josephson junctions in a loop, and extends it to an array with $N_{p-1}$ loops containing $N_p$ junctions in parallel (FIGS. 23a, 23b). The currents circulating the loops are split into vertical currents $I_j$ through the junctions and horizontal currents $J_j$ around the top and bottom of the $j^{th}$ loop. Also included is the bias current $I_{bj}$ injected into the array via the bias leads. Two biasing schemes are modelled; the first one assumes that the current is injected via one bias lead along the 1D array, $I_{bj}$ whose position can be chosen in the model (FIG. 17a) but is typically close to the centre of the array. The second scheme involves "homogeneously biasing" the array (FIG. 17b) via the same number of bias leads $N_p$ as there are junctions (up to $I_{bN_p}$). For each loop the standard Josephson equations that describe the current and voltage through the Josephson junctions as a function of the gauge invariant phase difference, $\phi_j$, are used to determine $I_j$. Kirchhoff's law is used to add these currents around each loop.

Then the flux in each loop, $\phi_j$, is calculated due to the applied flux and the flux due to the supercurrent circulating in the loops and flowing in the bias leads. Based on the second Ginzburg-Landau equation [1], a coupled system of first order differential equations for the $\phi_j$'s is then solved numerically.

$$\vec{J} = -\frac{1}{\mu_0 \lambda^2}\left(-\frac{\Phi_0}{2\pi}\vec{\nabla}\varphi + \vec{A}\right) \quad [1]$$

In equation [1] $\vec{j}$ is the current density, $\lambda$ is the penetration depth, $\mu_0$ is the permeability of free space, $\phi$ is the flux and $\vec{A}$ is the magnetic vector potential where $\vec{B}=\vec{\nabla}\times\vec{A}$. The self-inductances, kinetic inductances and mutual inductances from all loops were included in the calculations. Finally the time-averaged voltage <V> across the device is calculated from $d\phi_j/dt$, the time derivative of $\phi_j$, in normalized units. This method was first used to verify the voltage-magnetic field response derived by Oppenlander et al. (2000) for their LTS junctions in a 1D SQIF array. Then the following results were derived for HTS junctions in a 1D array with varying number of junctions in parallel, $N_p$. An important parameter, the SQUID inductance parameter $\beta_L=2I_cL_s/\Phi_0$ is similar to the single SQUID loop parameter and is proportional to the product of two variables; $I_c$, the average junction critical current and $L_s$, the average SQUID inductance i.e. the average of the self-inductance plus the kinetic inductance. Whilst the model considers the effect of variations in $\beta_L$ as a single variable, in practise when designing arrays, the experimental values of the individual parameters $I_c$ and $L_s$ are important design parameters.

It is noted that the model described here encompasses a large multi-parameter space to better reflect real-world HTS devices. Large statistical spreads ($\sigma$~30-35%) in device parameters such as $I_c$, and the junction normal resistance R, have been included in the model to replicate HTS device parameters previously reported in the literature. Likewise, a spread in loop area and/or loop inductance is used to model the arrays when the SQIF response is required. Therefore, this model examines parameter spreads in $I_cR$, $L_s$, as well as $N_p$, $\beta_L$ and the bias current $I_{bj}$. Thermal noise has not been added to the model, as results suggest that the inclusion of thermal noise equivalent to 77 K operation does not change the main conclusions or general trends described herein. The reason for this is that the total bias current, $I_b$ in the model was chosen to be larger than the sum of all the junction $I_c$'s.

Theoretical Modelling of 1D Parallel SQUID Arrays and SQIF Arrays

The experimental results for 1D SQUID arrays presented herein found that as the number of junctions (and therefore loops) increases beyond approximately 8-10, the magnetic field sensitivity of the array decreases, and the V-B responses become less periodic with counter intuitive voltage responses. In the following description, we model 1D SQUID and SQIF arrays with increasing numbers of junctions in the arrays, using similar parameters found in our experimental arrays, including variations in junction parameters typical found in HTS devices. The results are presented from theoretical calculations of 1D SQUID arrays (with equal area loops, i.e. $\sigma_A=0$) and 1D SQIF arrays (with a range in loop areas, $\sigma_A=0.07$, 0.3) and includes parameters and parameter spreads typically measured in experimental work. Calculations are presented in normalized units, in which the voltage responses are normalized to the $I_cR_n$ product whilst the applied flux is plotted in terms of the applied flux $\Phi_a$ normalized to the single flux quantum $\Phi_0$. Arrays are biased just above their critical current.

Figure 18:
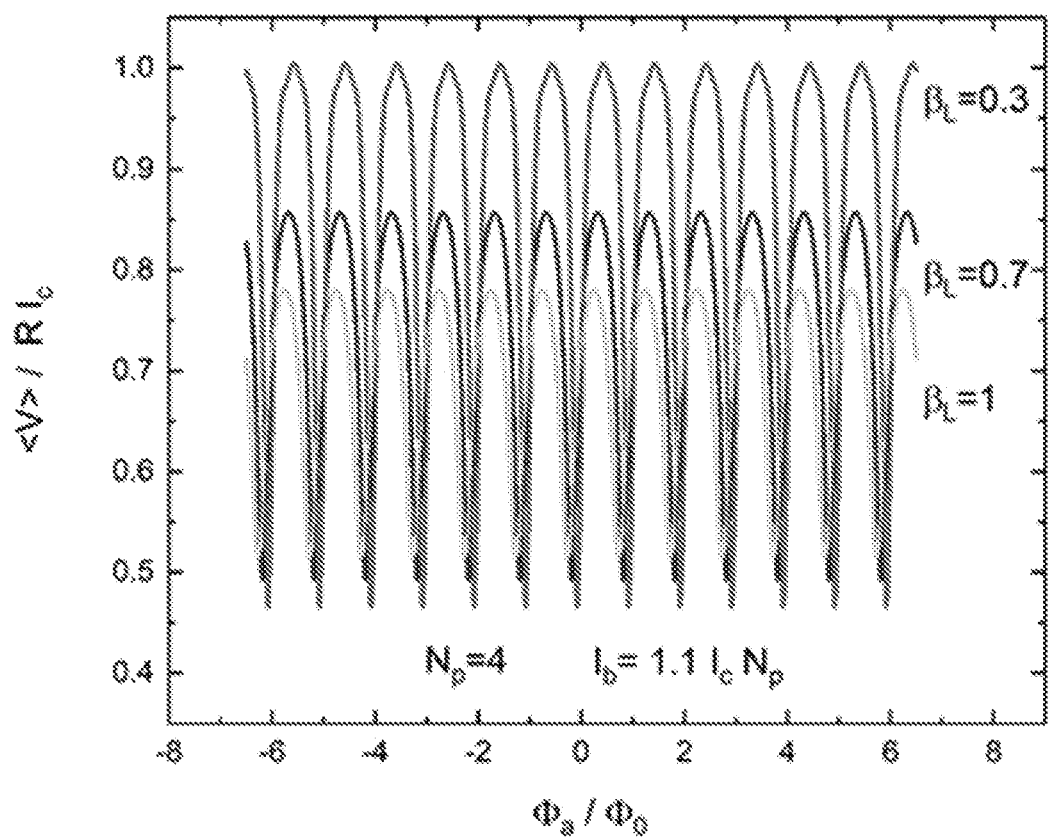
FIG. 18 illustrates the calculated V-$\Phi_a$ response for 1D arrays with $N_p$=4 junctions and three values of $\beta_L$=0.3, 0.7 and 1.0 with a bias current of 1.1×4$I_c$ which is injected into the centre of the array. All junction parameters are assumed to be identical ($\sigma_{Ic}$=$\sigma_R$=0).

SQUID Arrays with Equal Area Loops and Spread in Junction Parameters $\sigma_{Ic}$, $\sigma_R$ FIG. 18 shows examples of three V-$\Phi_a$ curves calculated using the model based on the 1D array shown in FIG. 2 with $N_p=4$ junctions for three values of $\beta_L=0.3$, 0.7 and 1.0 with the centre of the array biased at $1.1 \times 4I_c$. As $\beta_L$ increases the voltage modulation amplitude decreases and the slope of the V-$\Phi_a$ response decreases meaning the array sensitivity is decreasing. All curves show similar voltage peak heights for this range of flux/magnetic field which is in agreement with the experimental data in FIG. 21b. For $\beta_L \approx 0$, models predict a maximum voltage modulation of 1.0 (normalized) with minima reaching zero volts [Oppenlander et al. 2000]. However for these range of $\beta_L$, the model predicts that the voltage minima are 0.25-0.53 times the maximum voltage (FIG. 18). In fact for $\beta_L=0.3$ FIG. 18 indicates a peak-to-peak value of 0.53<V> which is in agreement with the experimental data shown in FIG. 15b with a modulation depth of ~0.37 times the maximum voltage for an array with $\beta_L=0.44$.

Figure 19A:
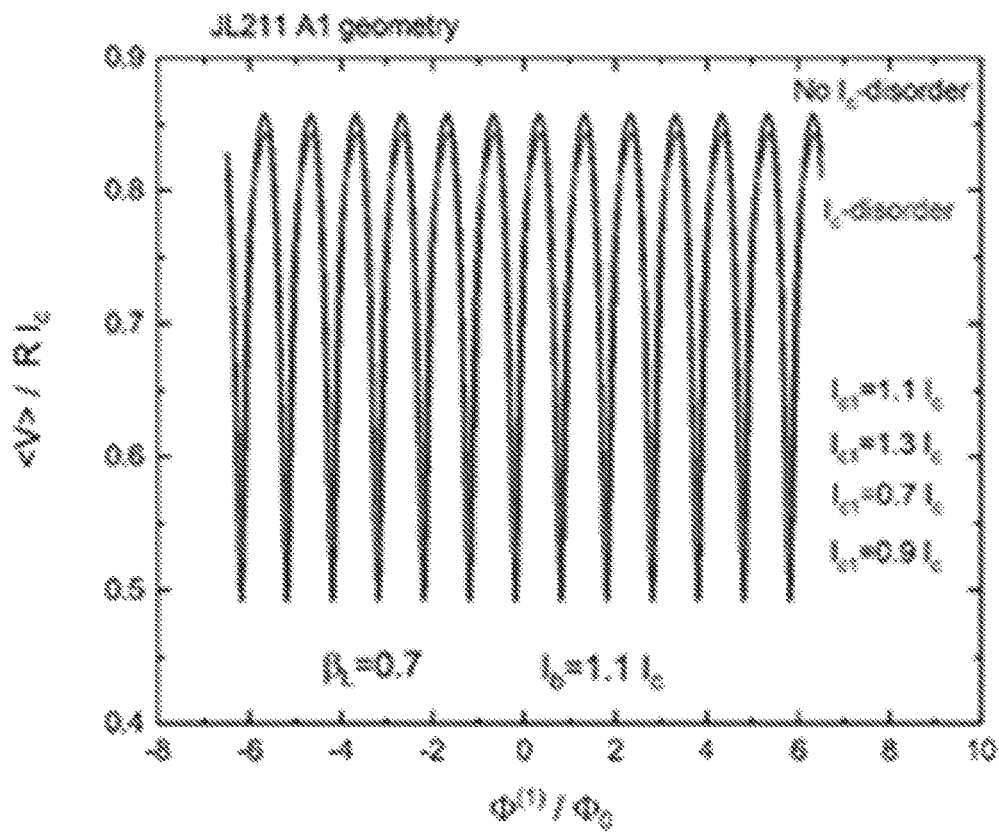
FIGS. 19a and 19b illustrate the V-$\Phi_a$ response for 1D arrays with $\beta_L$=0.7 and with $N_p$=4 junctions, biased at 1.1×4$I_c$ and with the following parameter spreads: (a) $I_c$ spread of $\sigma_{Ic}$=0.3 and (b) R spread of $\sigma_R$=0.3.
Figure 19B:
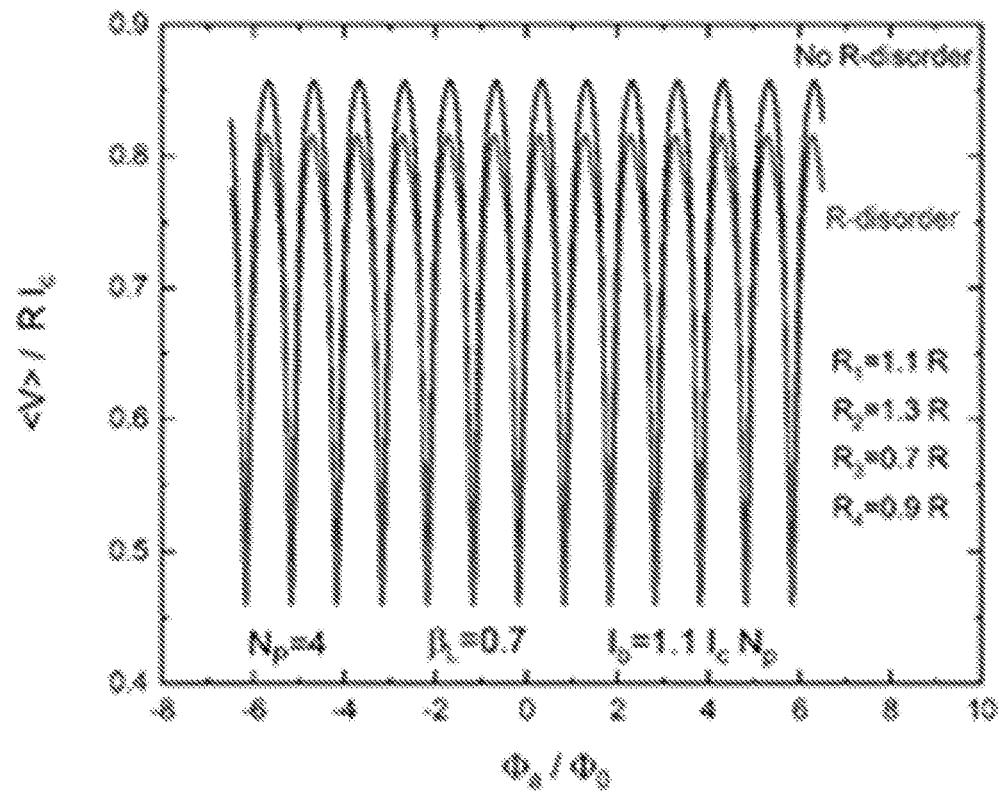

The proposed model may be extended to include spreads in the junction parameters that reflect typical variations observed experimentally in many HTS junctions including YBCO step-edge junctions [Lam, 2016]. FIGS. 19a and 19b compare the effect of $\sigma_{Ic}=0.3$ or $\sigma_R=0.3$ spread in $I_c$ and R, respectively on the V-$\Phi_a$ for $N_p=4$ junction array with $\beta_L=0.7$. The effect of $I_c$ spread, $\sigma_{Ic}$ was to reduce the voltage modulation by ~10% and introduce slight asymmetry, however the slope of the V-$\Phi_a$ peaks did not change appreciably. Likewise similar changes were observed when $\sigma_R=0.3$ was included into the calculations but noting again that the sensitivity remains similar to the uniform junction case.

Figure 17B:
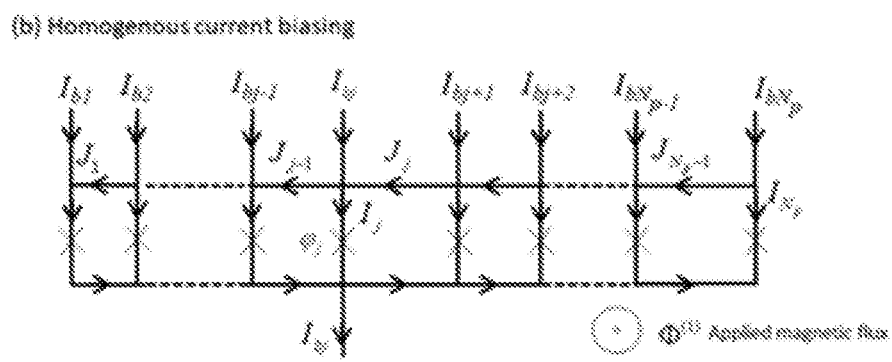
Figure 20A:
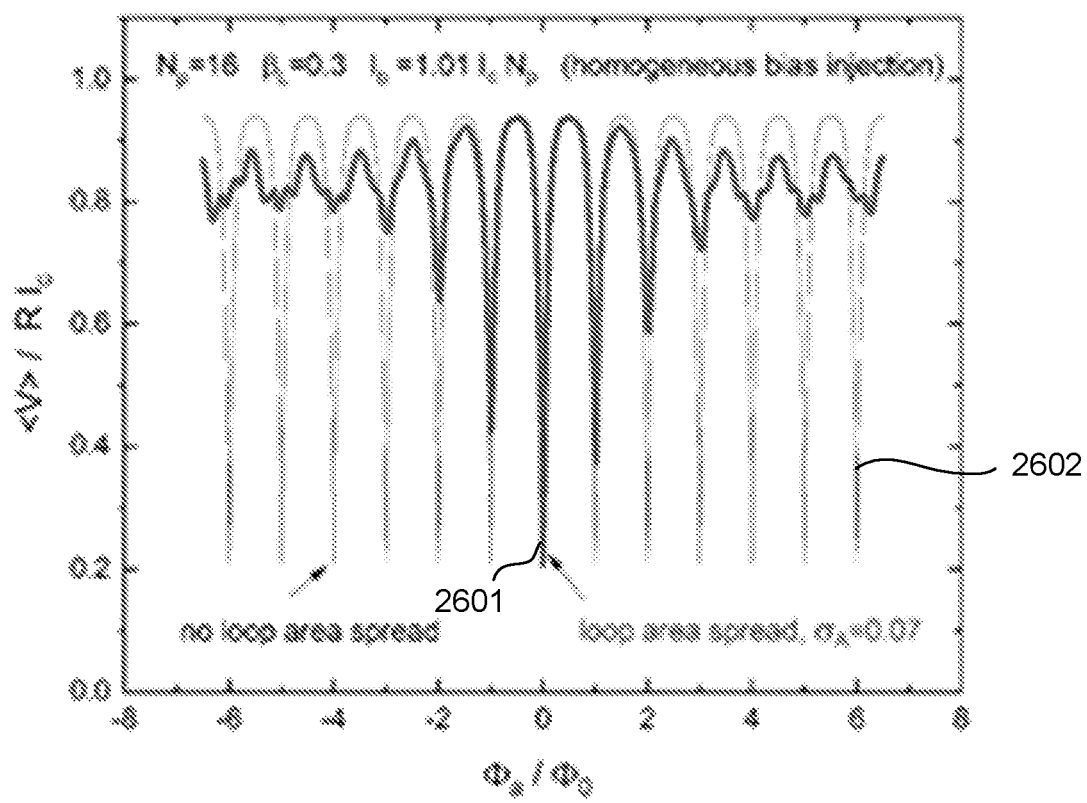
FIG. 20a illustrates normalized V-$\Phi_a$ response for 1D arrays with $N_p$=16 junctions and $\beta_L$=0.3, biased homogenously at 1.01$I_c$ comparing arrays with no loop area spread $\sigma_A$=0 and $\sigma_A$=0.07 spread in loop area.
Figure 20B:
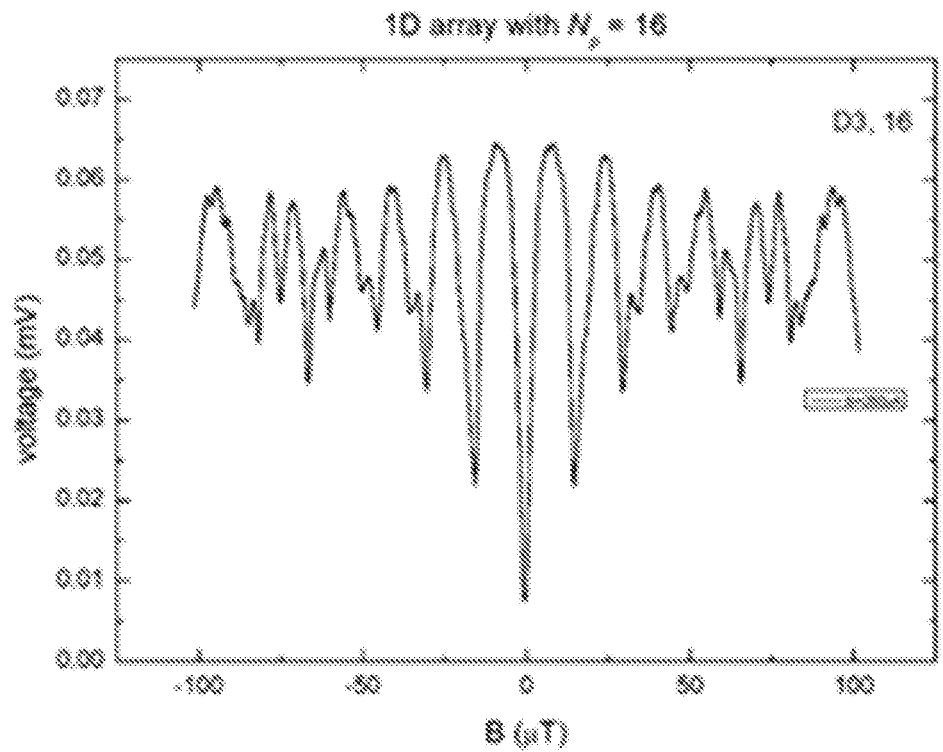
FIG. 20b illustrates experimental V-B data for equal loop area array with $N_p$=16 junctions.

SQIF Arrays With Loop Area Spreads, $\sigma_A=0.07$ to 0.3 and Current Biasing Geometry The previous disclosure modelled 1D arrays with no spread in loop areas ($\sigma_A=0$). FIG. 20a shows the case for an array with $N_p=16$ and $\beta_L=0.3$ was modelled with (2601) and without (2602) a small spread in loop areas ($\sigma_A=0.07$), but assumes no spread in junction parameters R and $I_c$. Such a spread in loop areas (~7%) might arise experimentally as a result of variations in fabrication due to photolithographic patterning differences, for example. The model assumes that the array is homogeneously biased (i.e. each SQUID loop in the 1D array is biased equally as shown in FIG. 17b. The array V-B response with $\sigma_A=0.07$ develops an envelope function with a gradual decrease in voltage peaks out to $\pm 3$ $\Phi_0$ beyond which the voltage varies non-periodically (FIG. 20a). The overall response of this modelled array resembles the general features seen in the experimental data for the $N_p=16$ equal loop area array measured in FIG. 21b, and reproduced in FIG. 20b.

Figure 21A:
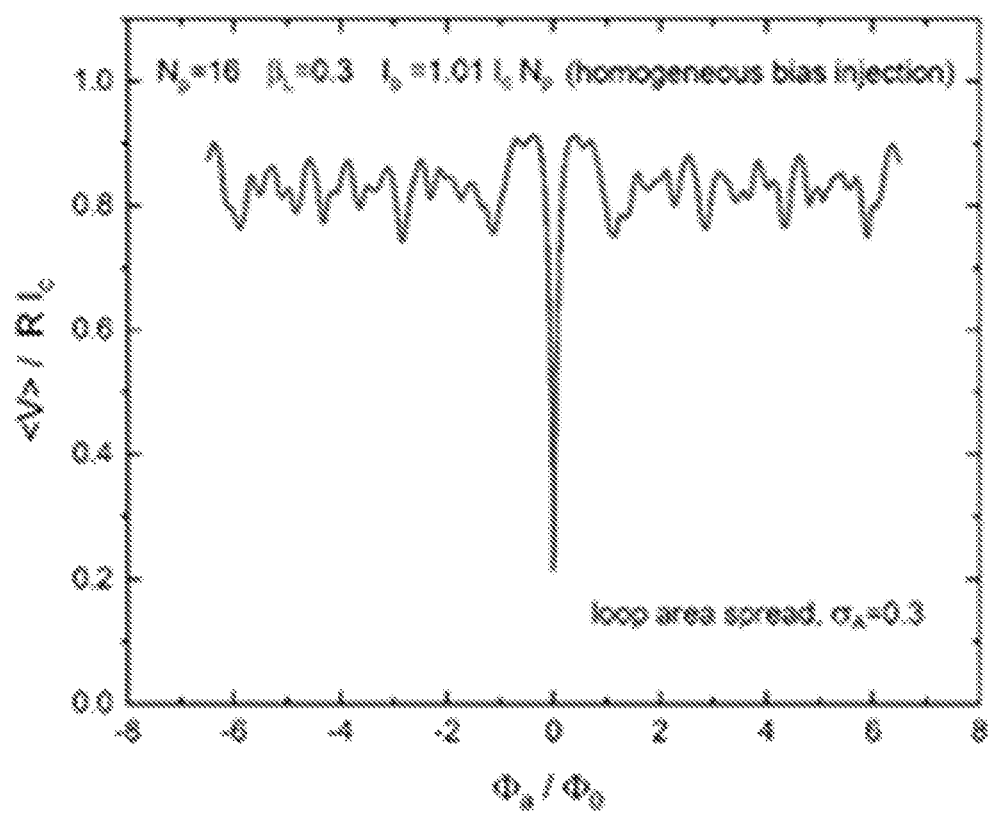
FIGS. 21a and 21b illustrate normalized V-$\Phi_a$ response for 1D arrays with $N_p$=16 junctions with $\beta_A$=0.3, and a spread of $\sigma_A$=0.3 in loop area (with $\sigma_{Ic}$=0, $\sigma_R$=0). A comparison of arrays is shown (a) homogeneously biased at 1.01$I_c$ and (b) centre biased at 1.01$N_pI_c$ overlaying the homogenously biased case from (a).
Figure 21B:
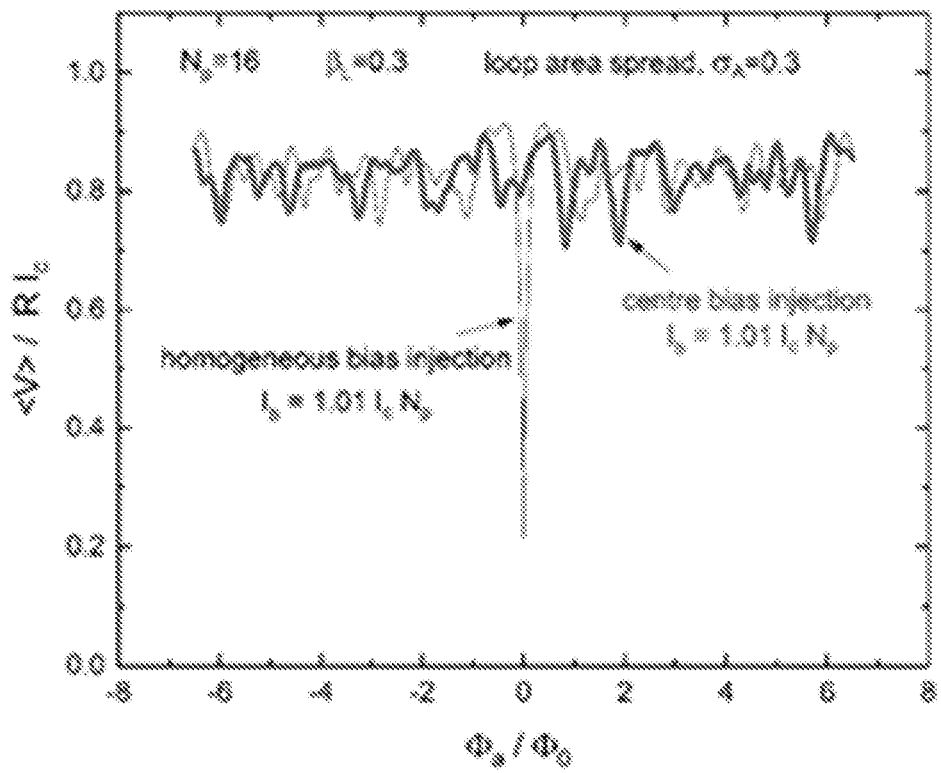
Figure 22:
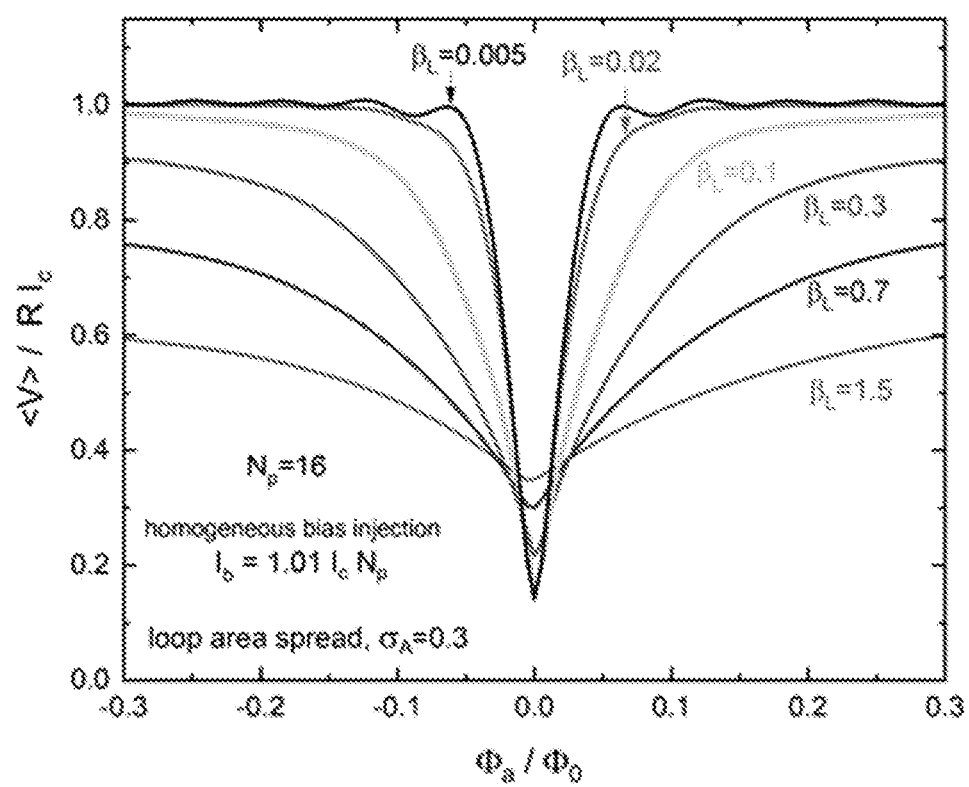
FIG. 22 illustrates the normalized V-$\Phi_a$ response for 1D arrays with $N_p$=16 junctions and a spread of $\sigma_A$=0.3 in loop area (with $\sigma_{Ic}$=0, $\sigma_R$=0) biased homogenously at 1.01$I_c$ with a range of average $\beta_L$ values from 0.005 to 1.5.

FIG. 21a shows the theoretical normalized voltage response to applied flux for a similar 1D array with $N_p=16$ loops, but with a larger spread in loop area of $\sigma_A=0.3$ with average $\beta_L=0.3$. This magnitude spread in loop areas is typical of that used to create SQIF arrays. The V-$\Phi_a$ response was calculated based on the applied flux per average loop area and by homogenously biasing the array. FIG. 21b shows modelling of the same SQIF array, but with the bias current applied to the centre of the array, as described earlier (FIG. 17a).

FIGS. 21a and 21b show a dramatic decrease in the central anti-peak creating a very low sensitivity array and a loss in symmetry of the V-$\Phi_a$ response about zero-field when the array is biased centrally. This behaviour is attributed to self-field effects. In order to optimally bias the single SQUID loops at the extremities of the 1D array, a large amount of current is injected at the centre of the array. In this example, assuming all junctions have the same critical current, $I_c$, then the bias current injected will be $I_b \approx 16 \times I_c$. This means that large amounts of bias current are being injected into the loops at the injection point of the array, generating large amounts of magnetic field (self-field) which couples flux into those loops in a non-optimal manner, degrading the sensitivity of the individual loops.

Effect on Sensitivity of Increasing N and Different Biasing Schemes with Various $\beta_L$ Combining the effects of several 1D array parameters, the theoretical calculations were extended to look at the effect of increasing array width $N_p$, and different biasing schemes (homogeneous and central biasing) for several different average $\beta_L$ values on the maximum normalized sensitivity, $|V_\Phi|_{max}$, where $V_\Phi$ is defined in Eq. [2] as:

$$V_\Phi = \frac{1}{RI_c} \frac{d\langle V \rangle}{d(\Phi_a/\Phi_0)} \qquad [2]$$

FIGS. 23a and 23b summarize these effects for 1D equal-loop area arrays in which the maximum normalized sensitivity, $|V_\Phi|_{max}$ is plotted against $N_p=3$ to 45, for three values of $\beta_L=0.1$, 0.3 and 0.7. When the array is homogeneously biased (FIG. 23a), the maximum sensitivity of the array increases as $N_p$ increases up until a certain value of $N_p$ that depends on $\beta_L$. For $\beta_L=0.1$, the sensitivity reaches a plateau of ~7.8 around $N_p \approx 10$ and does not greatly improve at higher $N_p$, but $\beta_L$ as increases the overall maximum sensitivity drops four-fold to around 2 (for $\beta_L=0.7$) and the plateau in sensitivity begins at lower values of $N_p \approx 4$. If instead the same arrays are centrally biased (FIG. 23b), the array sensitivity is lower overall for all scenarios (compare the same $\beta_L$ values in FIGS. 23a and 23b). For $\beta_L=0.1$ the maximum sensitivity theoretically predicted for a centrally biased array is only ~4.5 and occurs at $N_p=6$. Further increases in array width see a decrease in array sensitivity (2301), the plateau in FIG. 23a giving way instead to a maximum value in FIG. 23b at low values of $N_p$. As $\beta_L$ increases, this maximum is quenched such that when $\beta_L=0.7$, the array sensitivity only declines as $N_p$ increases from $N_p=2$. Note that all calculations in FIG. 23 assume no spread in array parameters, i.e. $\sigma_{Ic}$, $\sigma_R$, $\sigma_A=0$.

Effect of Spread in Junction Parameters $I_{cj}$, $R_j$ on 1D SQIF Arrays

Apart from FIG. 19, all theoretical calculations have assumed that the junction parameters ($I_{cj}$, $R_j$) have been identical for all junctions, j, in the array. However, high-$T_c$ junctions in particular can have a large spread in parameters due to a combination of short coherence lengths, and inherent variations in the growth of the grain boundaries forming the Josephson junctions. Spreads in $I_{cj}$ and $R_j$ may cover a wide range from 10% to 60%. Here we use a value of $\sigma_{Ic}$, $\sigma_R$ of 0.3, obtained from earlier measurements of step-edge junctions, in the theoretical calculations.

Figure 24A:
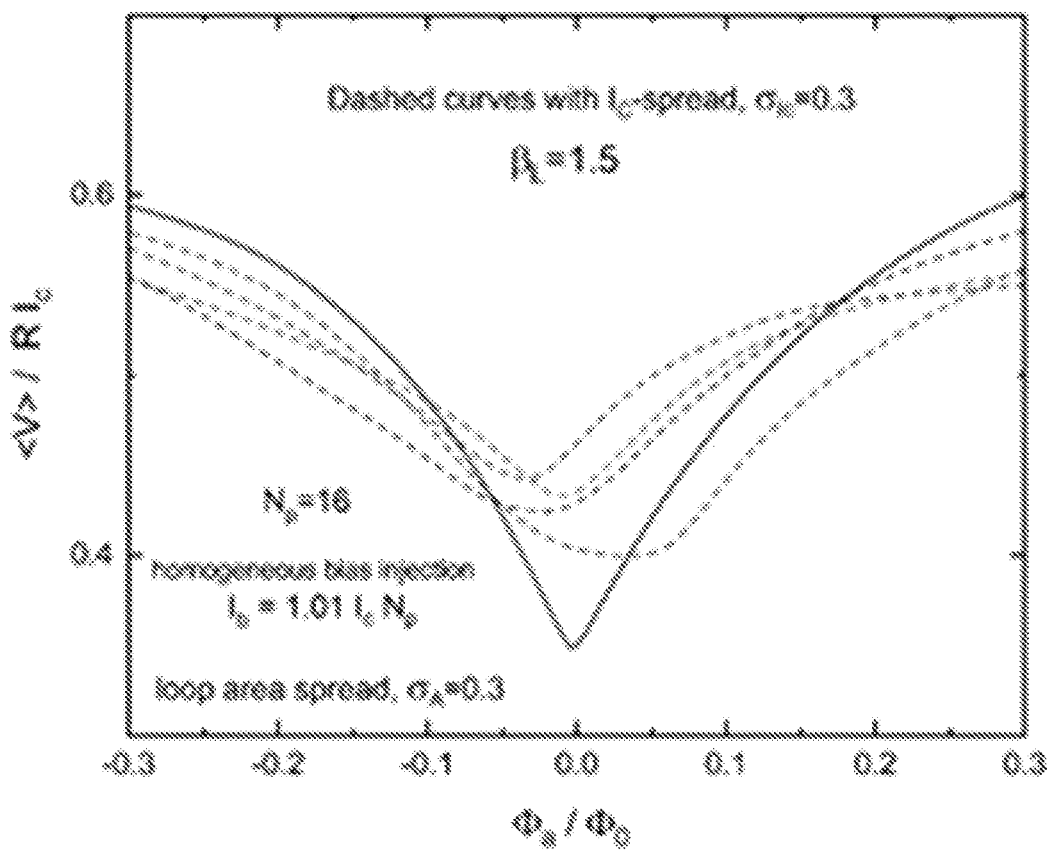
FIGS. 24a and 24b illustrate normalized V-$\Phi_a$ response for 1D arrays with $N_p$=16 junctions with $\sigma_A$=0.3 and using four random sets of junction parameters with spreads of (a) $\sigma_{Ic}$=0.3 whilst $\sigma_R$=0 and (b) $\sigma_R$=0.3 whilst $\sigma_{Ic}$=0 (dashed curves). Solid lines in (a) and (b) represent calculations when $\sigma_R$=$\sigma_{Ic}$=0. All 1D arrays have $\beta_L$=1.5 and are biased homogenously at 1.01$I_c$.
Figure 24B:
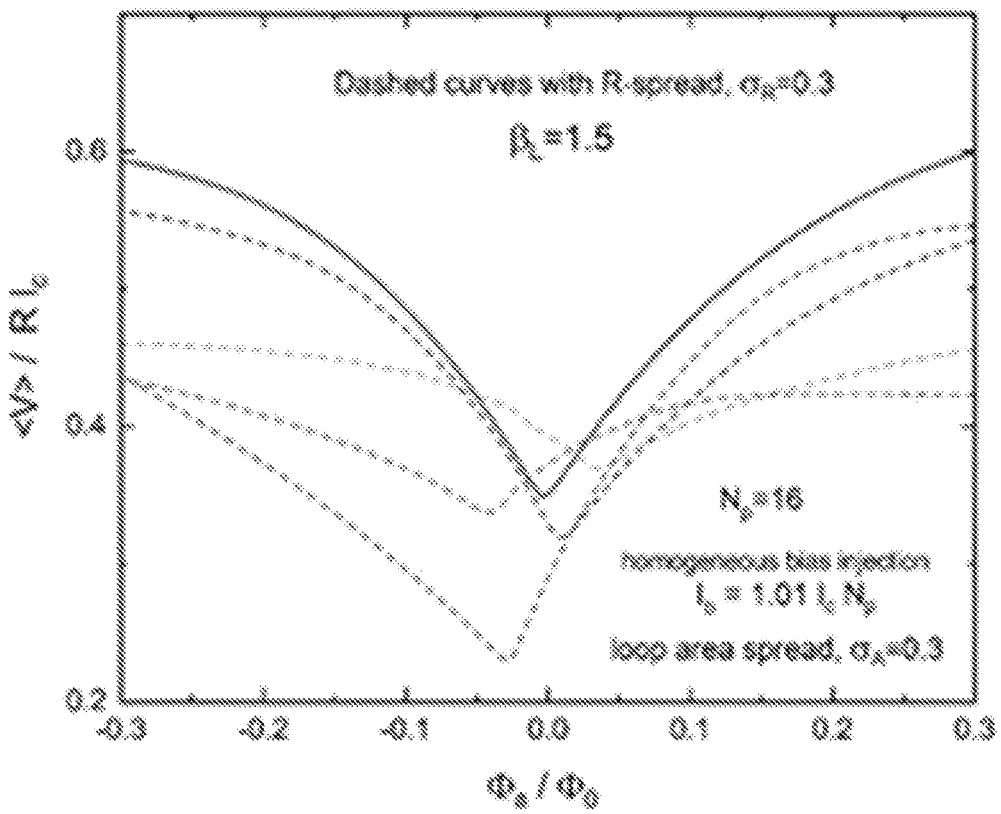
Figure 25A:
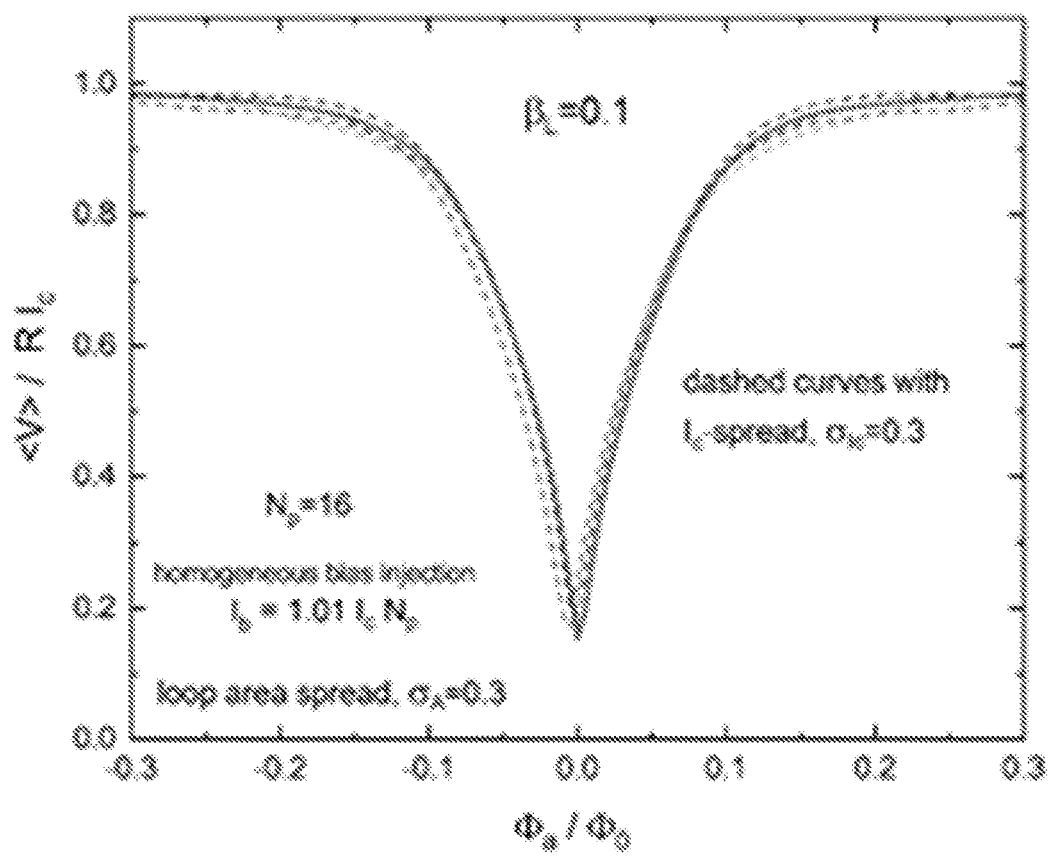
FIGS. 25a and 25b illustrate normalized V-$\Phi_a$ response for 1D arrays with $N_p$=16 junctions with $\sigma_A$=0.3 and using four random sets of junction parameters with spreads of (a) $\sigma_{Ic}$=0.3 whilst $\sigma_R$=0 and (b) $\sigma_R$=0.3 whilst $\sigma_{Ic}$=0 (dashed curves). Solid lines in (a) and (b) represent calculations when $\sigma_R$=$\sigma_{Ic}$=0. All 1D arrays have $\beta_L$=0.1 and are biased homogenously at 1.01$I_c$.
Figure 25B:
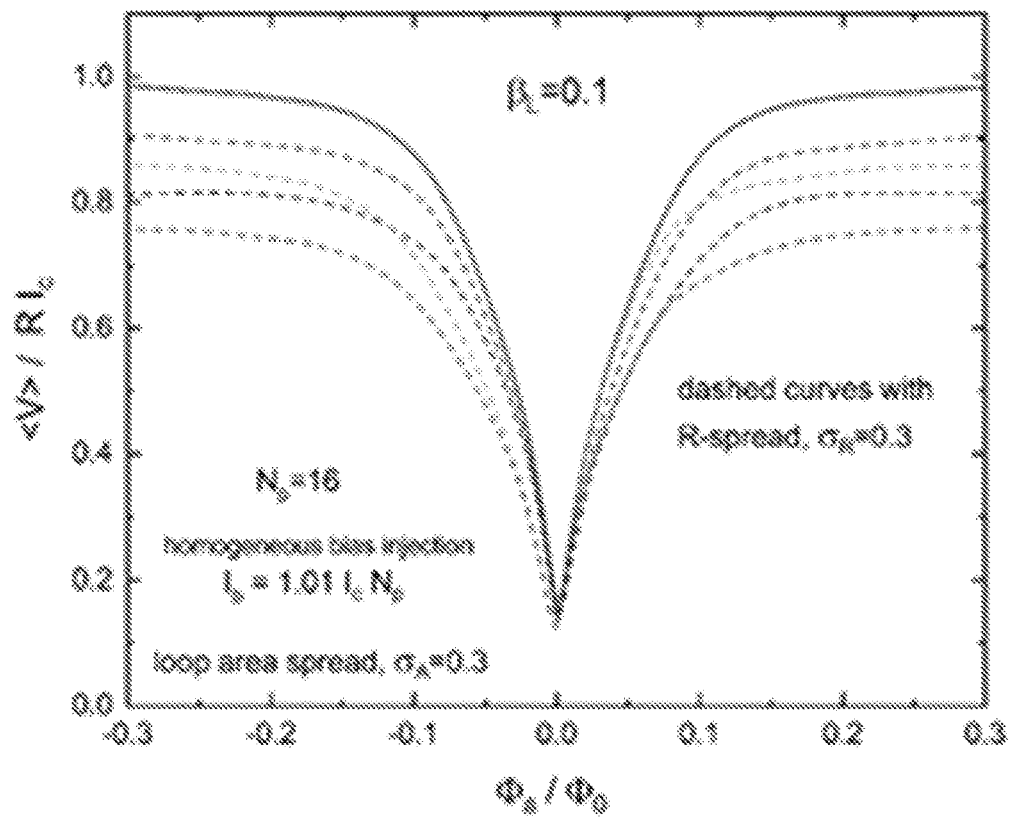

The curves for the normalized V-$\Phi_a$ response in FIGS. 24a and 24b were generated for 1D SQIF array with $N_p=16$ using four different sets of random values for the junctions with the spread in $I_c$ of $\sigma_{Ic}=0.3$ (FIG. 24a) or spread in $R_n$ of $\sigma_R=0.3$ (FIG. 23b) for 1D arrays with $\beta_L=1.5$ and with loop area spread $\sigma_A=0.3$ as used in FIG. 21a. The junction parameter spread has a variable and overall detrimental effect on the SQIF sensitivity.

CONCLUSIONS

In summary, the magnetic field performance for a number of 1D high-$T_c$ SQUID arrays with close to equal loop areas in parallel, which have a range of junction parameters, have been measured at 77 K and shown to develop increasingly poorer sensitivities (voltage modulation) as the 1D arrays increased in width. A theoretical model for 1D SQUID and SQIF arrays applicable for HTS thin films has been developed that includes variations in device parameters important to high-$T_c$ materials such as moderate variations in junction parameters ($I_{cj}$, $R_j$), loop areas (via the inductance parameter $\beta_L$) and the current biasing geometry of the arrays. The proposed model replicates the results from previous work on SQIFs (Oppenlander et al.) and shows that low $\beta_L$ is needed to improve the SQIF array sensitivity by increasing the slope of the anti-peak. Small variations (~7%) in loop areas, such as those created due to variations in fabrication processes due to, say under- or over-etching the array pattern unevenly across the array may account for deviations from the ideal expected V-B response, and produce envelope-shaped responses observed experimentally.

Both the experimental and theoretical modelling results suggest that, provided $\beta_L$ is kept small, then typical variations in junction parameters common in HTS devices (~30%) will not have a detrimental effect on the SQUID or SQIF array response. The array response (sensitivity) will be affected by the current biasing structure, particularly as the width of the array increases, and for devices with larger $\beta_L$ (>0.7). Homogeneous current biasing may help preserve the array sensitivity because this may help reduce self-field effects due to larger currents being injected into the arrays from a single point, coupling extra flux into loops across the array.

Figure 26:
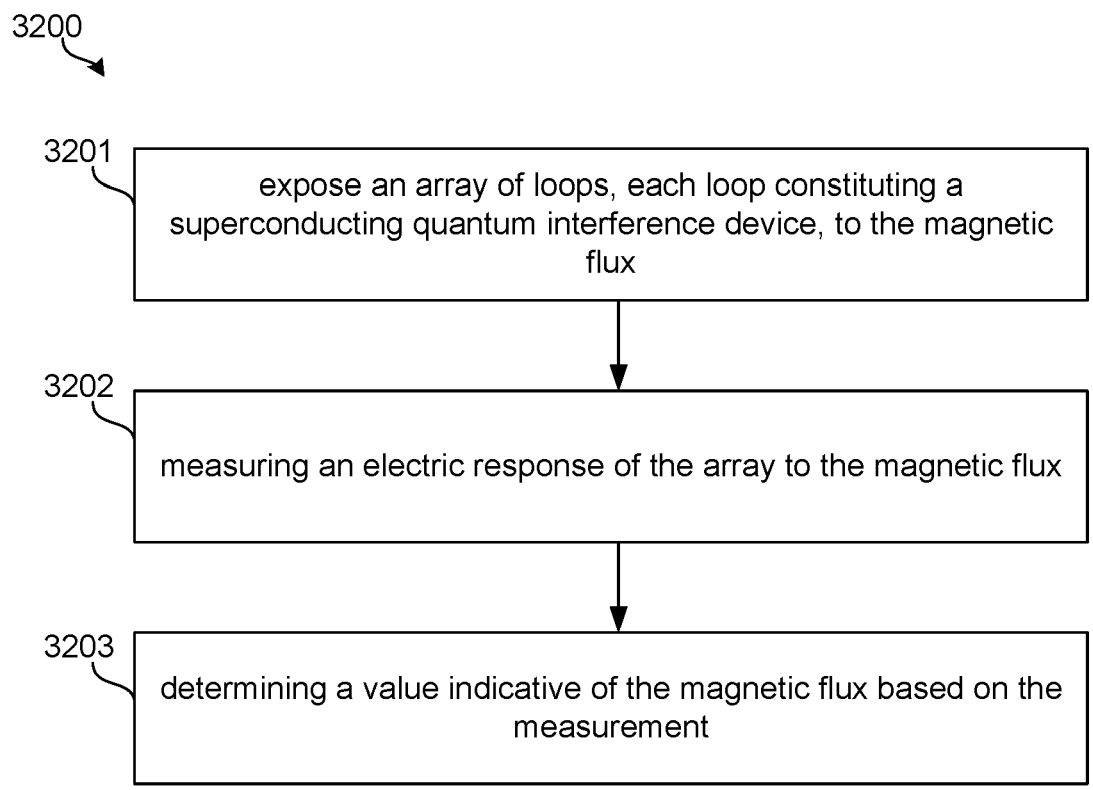
FIG. 26 illustrates a method of measuring magnetic flux.

FIG. 26 illustrates a method 3200 of measuring magnetic flux using the apparatus described herein. The method comprising the step of exposing 3201 an array of loops to the magnetic flux. Each loop constitutes a superconducting quantum interference device as described herein. The method 3200 then comprises measuring 3202 an electric response of the array to the magnetic flux, such as by measuring a current through the device. Then, a value indicative of the magnetic flux based on the measurement is determined 3203. It is noted that the array comprises multiple columns. Further, each of the columns comprises multiple rows connected in series and each of the multiple rows comprises a number of loops connected in parallel. Importantly, the number of loops connected in parallel in each row is more than two and less than 20 as this improves the measurement of the magnetic flux in the sense that a smaller magnetic flux can be measured (sensitivity), the magnetic flux is less distorted (linearity) and/or the range of the magnetic flux in greater (dynamic range) compared to other arrays.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A superconducting quantum interference apparatus comprising an array of loops, each loop constituting a superconducting quantum interference device, wherein
    the array comprises multiple columns,
    each of the columns comprises multiple rows connected in series,
    each of the multiple rows comprises a number of loops connected in parallel,
    the number of loops connected in parallel in each row is more than two and less than 20, and
    at least two of the multiple columns are connected in parallel.

2. The apparatus of claim 1, wherein the number of loops connected in parallel in each row is less than 10.

3. The apparatus of claim 2, wherein the number of loops connected in parallel in each row is less than 8.

4. The apparatus of claim 3, wherein the number of loops connected in parallel in each row is less than 7.

5. The apparatus of claim 1, wherein the apparatus is a superconducting quantum interference filter (SQIF).

6. The apparatus of claim 5, wherein the loops have loop areas that vary across the array.

7. The apparatus of claim 1, wherein the apparatus is a superconducting quantum interference device (SQUID) array.

8. The apparatus of claim 7, wherein the loops are connected in parallel in each row and have equal loop areas.

9. The apparatus of claim 1, wherein the columns comprise multiple sets of columns and the columns of each set are connected in series.

10. The apparatus of claim 9, wherein the series-connected columns of a first set are connected in parallel to series-connected columns of a second set.

11. The apparatus of claim 9, wherein the parallel-connected columns of a first set are connected in series to parallel-connected columns of a second set.

12. The apparatus of claim 1, wherein the apparatus improves a performance selected from one or more of:
    sensitivity;
    linearity; and
    dynamic range.

13. The apparatus of claim 1, wherein each of the loops are of high temperature superconducting material.

14. The apparatus of claim 1, wherein the columns comprise multiple sets of columns and the columns of each set are connected in parallel.

15. The apparatus of claim 1, wherein the impedance of the array is less than or equal to 1 kΩ.

16. The apparatus of claim 1, wherein the array comprises at least 1,000,000 loops.

17. The apparatus of claim 1, wherein the apparatus comprises at least 1,000,000 loops, the number of loops connected in parallel in each row is more than two and less than 20 and the number of loops connected in parallel in each row, the number of columns connected in series and the number of columns connected in parallel is such that an impedance of the array is less than or equal to 1 kΩ.

18. The apparatus of claim 1, wherein
the array comprises a number of at least two columns connected in parallel,
each of the columns comprises multiple rows connected in series,
each of the multiple rows comprises a number of loops connected in parallel, and
the number of loops connected in parallel in each row is more than two and less than ten times the number of columns connected in parallel.

19. The apparatus of claim 1, wherein
the apparatus comprises an array of at least 1,000,000 loops, each loop constituting a superconducting quantum interference device,
the array comprises a number of at least 100 columns connected in parallel,
each of the columns comprises multiple rows connected in series,
each of the multiple rows comprises a number of loops connected in parallel.

20. A non-transitory, computer readable medium with computer code stored thereon, wherein the computer code defines a quantum interference apparatus comprising an array of loops, each loop constituting a superconducting quantum interference device, wherein
the array comprises multiple columns,
each of the columns comprises multiple rows connected in series,
each of the multiple rows comprises a number of loops connected in parallel,
the number of loops connected in parallel in each row is more than two and less than 20, and
at least two of the multiple columns are connected in parallel.

21. A photo mask or set of photo masks defining a quantum interference apparatus comprising an array of loops, each loop constituting a superconducting quantum interference device, wherein
the array comprises multiple columns,
each of the columns comprises multiple rows connected in series,
each of the multiple rows comprises a number of loops connected in parallel,
the number of loops connected in parallel in each row is more than two and less than 20, and
at least two of the multiple columns are connected in parallel.

22. An electronic chip comprising an array of loops, each loop constituting a superconducting quantum interference device, wherein
the array comprises multiple columns,
each of the columns comprises multiple rows connected in series,
each of the multiple rows comprises a number of loops connected in parallel,
the number of loops connected in parallel in each row is more than two and less than 20, and
at least two of the multiple columns are connected in parallel.

23. A superconducting quantum interference apparatus comprising an array of loops, each loop constituting a superconducting quantum interference device, wherein
the array comprises multiple columns,
each of the columns comprises multiple rows connected in series,
each of the multiple rows comprises a number of loops connected in parallel,
the number of loops connected in parallel in each row is more than two and less than 20 to improve the sensitivity of the apparatus and the impedance of the array is less than or equal to 1 kΩ, and
at least two of the multiple columns are connected in parallel.

* * * * *